(12) United States Patent
Roscheisen et al.

(10) Patent No.: US 7,253,017 B1
(45) Date of Patent: *Aug. 7, 2007

(54) MOLDING TECHNIQUE FOR FABRICATION OF OPTOELECTRONIC DEVICES

(75) Inventors: Martin R. Roscheisen, San Francisco, CA (US); Brian M. Sager, Palo Alto, CA (US); Jacqueline Fidanza, San Francisco, CA (US); Klaus Petritsch, Foster City, CA (US); Gregory A. Miller, Menlo Park, CA (US); Dong Yu, Menlo Park, CA (US)

(73) Assignee: Nanosolar, Inc., Palo Alto, CA (US)

( * ) Notice: Subject to any disclaimer, the term of this patent is extended or adjusted under 35 U.S.C. 154(b) by 596 days.

This patent is subject to a terminal disclaimer.

(21) Appl. No.: 10/303,665

(22) Filed: Nov. 22, 2002

Related U.S. Application Data

(63) Continuation-in-part of application No. 10/290,119, filed on Nov. 5, 2002.

(60) Provisional application No. 60/390,904, filed on Jun. 22, 2002.

(51) Int. Cl.
*H01L 21/00* (2006.01)

(52) U.S. Cl. .................. 438/57; 136/250; 136/252; 136/263; 257/40; 257/43; 257/79; 438/63; 438/82; 438/85

(58) Field of Classification Search ........... 136/250, 136/252, 263, 260, 265; 257/40, 43, 79, 257/103, 431; 438/57, 63, 82, 85, 99, 104, 438/689

See application file for complete search history.

(56) References Cited

U.S. PATENT DOCUMENTS

| | | | |
|---|---|---|---|
| 4,499,658 A | 2/1985 | Lewis | .......... 438/64 |
| 5,482,570 A | 1/1996 | Saurer et al. | ......... 136/255 |
| 5,525,440 A | 6/1996 | Kay et al. | .......... 429/111 |

(Continued)

FOREIGN PATENT DOCUMENTS

| | | |
|---|---|---|
| DE | 2741954 | 3/1979 |
| EP | 1028475 A1 | 8/2000 |
| EP | 1087446 A2 | 3/2001 |
| WO | WO 02/084708 | 10/2002 |

OTHER PUBLICATIONS de Tacconi et al, "Semiconductor nanostructures in an alumina template matrix: micro- versus macro-scale photoelectrochemical behavior," Electrochimica Acta, vol. 47, pp. 2603-2613, Apr. 7, 2002.*

(Continued)

*Primary Examiner*—Nam Nguyen
*Assistant Examiner*—Anthony Fick

(57) ABSTRACT

Charge splitting networks for optoelectronic devices may be fabricated using a nanostructured porous film, e.g., of $SiO_2$, as a template. The porous film may be fabricated using surfactant temptation techniques. Any of a variety of semiconducting materials including semiconducting metals and metal oxides (such as $TiO_2$, CdSe, CdS, CdTe, or CuO) may be deposited into the pores of the porous template film. After deposition, the template film may be removed by controlled exposure to acid or base without disrupting the semiconducting material leaving behind a nanoscale network grid. Spaces in the network grid can then be filled with complementary semiconducting material, e.g., a semiconducting polymer or dye to create a exciton-splitting and charge transporting network with superior optoelectronic properties for an optoelectronic devices, particularly photovoltaic devices.

30 Claims, 10 Drawing Sheets

U.S. PATENT DOCUMENTS

| | | | | |
|---|---|---|---|---|
| 5,571,612 | A | 11/1996 | Motohiro et al. | 428/323 |
| 5,674,325 | A | 10/1997 | Albright et al. | 126/250 |
| 5,795,559 | A * | 8/1998 | Pinnavaia et al. | 423/702 |
| 5,986,206 | A | 11/1999 | Kambe et al. | 136/263 |
| 5,990,415 | A | 11/1999 | Green et al. | 136/255 |
| 6,075,203 | A | 6/2000 | Wang et al. | 136/256 |
| 6,270,846 | B1 | 8/2001 | Brinker et al. | 427/385.5 |
| 6,278,056 | B1 | 8/2001 | Sugihara et al. | 136/263 |
| 6,291,763 | B1 | 9/2001 | Nakamura | 136/256 |
| 6,340,789 | B1 | 1/2002 | Petritsch et al. | 136/263 |
| 6,709,929 | B2 * | 3/2004 | Zhang et al. | 438/268 |
| 6,733,828 | B2 * | 5/2004 | Chao et al. | 427/239 |
| 6,852,920 | B2 * | 2/2005 | Sager et al. | 136/263 |
| 6,919,119 | B2 * | 7/2005 | Kalkan et al. | 428/119 |
| 6,946,597 | B2 * | 9/2005 | Sager et al. | 136/263 |
| 2002/0017656 | A1 | 2/2002 | Graetzel et al. | |
| 2002/0134426 | A1 | 9/2002 | Chiba et al. | |
| 2002/0192441 | A1 | 12/2002 | Kalkan et al. | 428/209 |
| 2003/0226498 | A1 | 12/2003 | Alivisatos et al. | 117/84 |
| 2004/0048092 | A1 * | 3/2004 | Yasui et al. | 428/642 |
| 2004/0084080 | A1 * | 5/2004 | Sager et al. | 136/263 |
| 2004/0109666 | A1 * | 6/2004 | Kim | 385/147 |
| 2004/0118448 | A1 | 6/2004 | Scher et al. | 136/252 |
| 2004/0118698 | A1 * | 6/2004 | Lu et al. | 205/224 |
| 2004/0146560 | A1 | 7/2004 | Whiteford et al. | 424/484 |
| 2004/0178390 | A1 | 9/2004 | Whiteford et al. | 252/500 |
| 2005/0082543 | A1 * | 4/2005 | Alizadeh et al. | 257/79 |
| 2005/0098204 | A1 * | 5/2005 | Roscheisen et al. | 136/263 |
| 2005/0098205 | A1 * | 5/2005 | Roscheisen et al. | 136/263 |
| 2005/0183767 | A1 | 8/2005 | Yu et al. | 136/263 |
| 2005/0183768 | A1 | 8/2005 | Roscheisen et al. | 136/263 |
| 2005/0206306 | A1 * | 9/2005 | Perlo et al. | 313/504 |

OTHER PUBLICATIONS

Ryoo, R., Ko, C. H., Kruk, M., Antochshuk, V., and Jaroniec, M., Block-Copolymer-Templated Ordered Mesoporous Silica: Array of Uniform Mesopores or Mesopore-Micropore Network?, J. Phys. Chem. B, 104, 2000, pp. 11465-11471.*

M. Granstrom, K. Petritsch, A. C. Arias, A. Lux, M. R. Andersson & R. H. Friend. 1998. Laminated fabrication of polymeric photovoltaic diodes. Nature 395, 257-260.

Gebeyehu, D., Brabec, C.J., Saricifti, N.S., Vangeneugden, D., Kiebooms, R., Vanderzande, D., Kienberger, F., and H. Schnindler. 2002. Hybrid Solar Cells based on dye-sensitized nanoporous TiO2 electrodes and conjugated polymers as hole transport materials. Synthetic Metals 123, 279-287.

Greg P. Smestad, Stefan Spiekermann, Janusz Kowalik, Christian D. Grant, Adam M. Schwartzberg, Jin Zhang, Laren M. Tolbert, and Ellen Moons. 2002. A technique to compare polythiophene solid-state dye sensitized TiO2 solar cells to liquid junction devices.Solar Energy Materials & Solar Cells, in press.

Hongyou Fan, Yunfeng Lu, Aaron Stump, Scott T. Reed, Tom Baer, Randy Schunk, Victor Perez-Luna, Gabriel P. Lopez, & C. Jeffrey Brinker. 2000. Rapid prototyping of patterned functional nanostructures , Nature 404, 56-60.

Alan Sellinger, Pilar M.Weiss, Anh Nguyen, Yunfeng Lu, Roger A. Assink, Weiliang Gong & C. Jeffrey Brinker. 1998. Continuous self-assembly of organic-inorganic nanocomposite coatings that minic nacre. Nature 394, 256-260.

Yunfeng Lu, Rahul Ganguli, Celeste A. Drewien, Mark T. Anderson, C. Jeffrey Brinker, Weilang Gong, Yongxing Guo, Hermes Soyez, Bruce Dunn, Michael H. Huang & Jeffrey I. Zink. 1997. Continuous formation of supported cubic and hexagonal mesoporous films by sol-gel dip coating. Science 288, 652-656.

L. Schmidt-Mende, A. Fechtenkotter, K. Mullen, E. Moons,R. H. Friend, J. D. MacKenzie. 2002. Self-Organized Discotic Liquid Crystals for High-Efficiency Organic Photovoltaics. Science 293, 1119-1122.

Wendy U. Huynh, Janke J. Dittmer, A. Paul Alivisatos. 2002. Hybrid Nanorod-PolymerSolar Cells. Science 295, 2425-2427.

Thuc-Quyen Nguyen, Junjun Wu, Vinh Doan, Benjamin J. Schwartz, Sarah H. Tolbert. 2000. Control of Energy Transfer in Oriented Conjugated Polymer-Mesoporous Silica Composites. Science 288, 652-656.

Heeger, A.J. 2000. Semiconducting and metallic polymers: the fourth and fifth generation of polymeric materials. Synthetic Metals 125, 23-42.

U.S. Appl. No. 10/290,119, entitled "Optoelectronic Device and Fabrication Method," to Brian M. Sager et al, filed Nov. 5, 2002.

U.S. Appl. No. 10/319,406, entitled "Nano-Architected/Assembled Solar Electricity Cell" to Brian M. Sager et al, filed Dec. 11, 2002.

Merriam Webster Online Dictionary entry for "substantial" [online], [retrieved on Sep. 15, 2004]. Retrieved from the Internet ,<URL: http://www.m-w.com/cgi-bin/dictionary?book=Dictionary &va=substantially>.

Merriam Webster Online Dictionary entry for "template" [online], [retrieved on Jul. 7, 2004]. Retrieved from the Internet ,<URL: http://www.m-w.com/cgi-bin/dictionary?book=Dictionary &va=template>.

Merriam Webster Online Dictionary entry for "include" [online], [retrieved on Jun. 14, 2004]. Retrieved from the Internet ,<URL: http://www.m-w.com/cgi-bin/dictionary?book=Dictionary &va=include>.

D. Zhao et al. "Triblock Colpolymer Syntheses of Mesoporous Silica with Periodic 50 to 300 Angstrom Pores" Science, 279, 548-552. (1998).

R. Ryoo et al. "Block-Copolymer-Templated Ordered Mesoporous Silica: Array of Uniform Mesopores or Mesopore-Micropore Network?" J. Phys. Chem. B. 104, 11465-11471. (2000).

M.H. Huang et al. "Catalytic Growth of Zinc Oxide Nanowires by Vapor Trasnport" Adv. Mater. 13, 113-116 (Jan. 2001).

* cited by examiner

MOLDING TECHNIQUE FOR FABRICATION OF OPTOELECTRONIC DEVICES

CROSS-REFERENCE TO AN EARLIER FILED APPLICATION

This application claims priority to U.S. Provisional Patent Application 60/390,904, filed Jun. 22, 2002, the entire disclosures of which are incorporated herein by reference. This application is also a continuation-in-part of U.S. patent application Ser. No. 10/290,119 to Brian Sager et al, entitled "OPTOELECTRONIC DEVICE AND FABRICATION METHODS", filed Nov. 5, 2002, the entire disclosures of which are incorporated herein by reference.

FIELD OF THE INVENTION

This invention generally relates to optoelectronic devices and more particularly to photovoltaic, e.g., solar cell, devices.

BACKGROUND OF THE INVENTION

Optoelectronic devices interact with radiation and electric current. Solar cells are a particular example of a useful class of optoelectronic devices. Organic solar cell technology has been actively pursued in the research community due to its promise of lower cost, easier manufacturability, and other potential advantages such as flexible sheets of solar cells and various novel form factors.

Unlike Silicon solar cells, where photon absorption results in the formation of a free electron and hole, photo-excitation in organic semiconductors leads to the formation of a bound electron/hole pair (an "exciton"). In most semiconducting (conjugated) polymers or small molecules, excitons are formed when exposed to radiation such as light. These excitons typically travel for about one exciton diffusion length (typically about 10 nm) before the electron and hole recombine returning their energy by emitting light and/or heat. The exciton diffusion length can vary, depending on the specific organic compound, between 2 nm and several hundred nm.

To serve as a source for electrical energy, the electron and the hole comprising an exciton in an organic material must be separated so that the charges can be collected at different electrodes. To do so in an optimal way, an exciton-splitting and transporting network must be structured where the interfaces between electron- and hole-accepting materials are spaced in, e.g., respective 10-nm arrays within the active area of the solar cell device. At such interfaces, the electrons transfer into and move through the electron-accepting material, while the holes travel through the hole-accepting material.

Until recently, there have been only a few attempts to create a more optimal exciton-splitting and transporting network in an organic or plastic solar cell.

For example, Halls et al (Nature vol. 376, p 498, 1995) constructed an interpenetrating mixture of organic polymers to increase the surface area between the electron and hole accepting materials. In particular, they mixed a blend of the conjugated polymers (i) soluble MEH-PPV (as a hole-acceptor) and (ii) CN-PPV (as an electron acceptor) in a ~1:1 ratio to create an active layer in an organic photovoltaic device that showed an external quantum efficiency (EQE) of 6%. This EQE was two orders of magnitude higher than the single layer structures of MEH-PPV (0.04%) and CN-PPV (0.001%). Higher efficiencies were not obtained since the phase separating network was essentially random with isolated "islands", phases/features that were too large (10-100 nm) and poor connectivity with the respective electrodes.

More recently, Huynh et al. (Science, vol. 295, pp. 2425-2427, 2002) have reported the fabrication of hybrid nanorod-polymer solar cells. These cells have an EQE of 54%, a polychromatic efficiency of 1.7%, and are composed of a random assembly of CdSe nanorods in poly-3(hexylthiophene). The totally random and highly inefficient placement of the nanorods lowered the solar cell efficiency from what would be expected if the exciton-separating network was ordered and interconnected on the desired 10-nm scale.

Granstrom et al. (Cavendish Laboratory) have shown that phase separation on a scale of about 50 nm can be obtained through lamination of two semiconductive polymers giving polychromatic efficiency of 1.9% (Nature, vol. 385, pp. 257-260). The interpenetrating network obtained this way is still not on the optimal size scale (about 10 nm) for these polymers. Conjugated polymers are known to be better hole conductors than electron conductors.

Similarly, in recent work at Cambridge University, Schmidt-Mende et al. (Science, vol. 293, pp. 1119-1122, 2002) made spatially organized thin films of perylene dye with a liquid crystal polymer, and achieved an EQE of 34%, a 1.9% polychromatic cell efficiency; however the efficiency was low owing to the 100-200-nm scale of the interpenetrating dye/polymer mixture used as a crude charge separating network.

In the solar cell devices constructed by these and other groups, the device architectures are sub-optimal compared to that needed for higher-efficiency devices. These prior art devices are limited by the extent to which excitons can be harvested to perform useful work. This is due to two key factors:

First, in cells created with semiconducting nanorods, the nanorods within the solar cells were randomly arranged within a medium of conducting polymer. Since many nanorods were only partially aligned and large clusters of nanorods (interspersed with areas of few rods) were present in the devices, many excitons traveling through the active layers of these devices did not reach an electron affinity junction before spontaneously recombining. As the spacing of the nanorods was random, some areas of the device had many nanorods within 10 nm of one another, while many other areas of the device had no nanorods at all within 10 nm of one another (resulting in "dead" absorption space). This factor decreased the efficiency of both electron and hole transfer at differential electron affinity junctions between nanorods and conducting polymer.

Second, in cells composed of mixtures of perylene dye and liquid crystal polymers, the rough 100-200 nm scale of the interpenetrating dye/polymer interface resulted in low interfacial surface area, and thus the failure of many excitons traveling through such devices to reach an electron affinity junction before spontaneously recombining.

Furthermore, the movement of electrons through the material required regularly and continuously spaced nanorods, which could collect and transport free electrons to the outer boundary of the nanorod layer. This factor decreased the hole and electron collection efficiency. All of these factors combine to reduce the efficiency of the device, and therefore the potential electric power that can be produced by the solar cell.

An alternative approach to building an organic solar cell has been developed by Michael Graetzel and his colleagues, who have constructed dye-sensitized, nanocrystalline $TiO_2$ based solar cells using a liquid electrolyte (Kohle et al., Advanced Materials, vol. 9, p. 904, 1997). In this device structure, referred to herein as the "Graetzel cell", 20 nm diameter nanoparticles of $TiO_2$ are chemically bonded to Ruthenium dye molecules. Upon absorbing light, the Ruthenium dye molecules inject an electron into the titanium dioxide, which becomes positively charged as a result. Unfortunately, the Graetzel cell is relatively thick, e.g., several microns in thickness. The $TiO_2$ nanoparticles are immersed in an electrolyte. By immersing such a $TiO_2$ "paste" into a liquid redox electrolyte with $I^-/I_2$ species, the positive charge of the dye molecules is neutralized, closing the circuit. The Graetzel cell is known to be able to generally reach 10% polychromatic efficiency. The shortcoming of the Graetzel cell is its lack of long-term stability, with no solution being known to effective seal the cell with the liquid $I^-/I_2$ electrolyte while remaining efficient and stable over several years. Furthermore, the three-dimensional charge splitting network in a Graetzel cell is essentially random, presenting many curves for the liquid electrolyte to penetrate. For example, a hole-accepting polymer can be incorporated as a replacement for the liquid electrolyte. Unfortunately, the polymer cannot effectively be filled in uniformly in the particle region, as many of the randomly formed spaces around the $TiO_2$ nanoparticles do not provide effective access to the polymer to be incorporated into the film. Therefore, even if a Graetzel cell uses a solid electrolyte, the pore size distribution, pore spacing and pore filling are less than optimal.

Thus, there is a need in the art for optoelectronic devices, including solar cells that overcome the above disadvantages and a corresponding need for methods and apparatus for producing such devices.

SUMMARY OF THE INVENTION

The disadvantages associated with the prior art are overcome by embodiments of the present invention directed to methods for manufacturing exciton-splitting and transporting networks for optoelectronic devices.

According to an embodiment of the invention, an optoelectronic device includes a nanoscale grid network and a network-filling material that substantially fills spaces in the nanoscale grid network. The network-filling material and nanoscale grid network have complementary charge-transfer properties with respect to each other. The nanoscale grid network has interconnected structures of between about 1 nm and about 100 nm in diameter that are distributed in a substantially uniform fashion with neighboring pores separated by a distance of between about 1 nm and about 100 nm. The structures are interconnected and accessible from an underlying layer and/or overlying layer (if any).

According to an embodiment of a method for making such an optoelectronic device, the nanoscale grid network may be formed on a substrate by first forming a porous template, e.g., using surfactant temptation technique. After a pore-filling material is deposited in the pores of the porous template, the template is removed, leaving behind a nanoscale grid network. Spaces in the grid-network are filled with a network-filling material having complementary charge transfer properties with respect to the material of the nanoscale network grid.

According to another embodiment of the invention, a solar power generation system may include an array of photovoltaic cells, wherein one or more cells in the array includes one or more porous exciton-splitting and charge transporting networks disposed between a first electrode and a second electrode. Two or more cells in the array may be electrically connected in series.

Embodiments of the present invention provide new and useful optoelectronic devices including photovoltaic devices, as well as power generation systems that may be formed relatively inexpensively and on a large scale.

DETAILED DESCRIPTION OF THE INVENTION

Contents

I. Glossary

II. General Overview

III. Solar Cell Device Architecture

IV. Alternative Embodiments

V. Conclusion

I. GLOSSARY

Figure 1A:
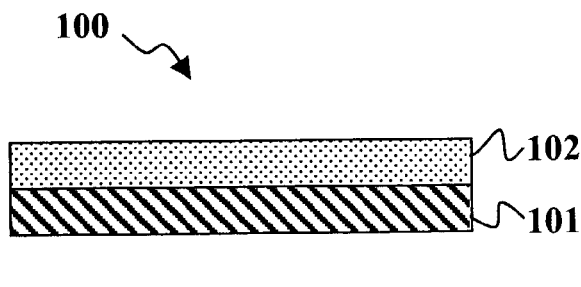
FIG. 1A depicts a solar cell according to the prior art

The following terms are intended to have the following general meanings as they are used herein:

Device: An assembly or sub-assembly having one or more layers of material.

Semiconductor: As used herein, semiconductor generally refers to a material characterized by an electronic bandgap typically between about 0.5 eV and about 3.5 eV.

Hole-Acceptor, Electron-Acceptor: In the case of semiconductor materials, hole-acceptor and electron-acceptor are relative terms for describing charge transfer between two materials. For two semiconductor materials wherein a first material has a valence band edge or highest occupied molecular orbital (HOMO) that is higher than the corresponding valence band edge or HOMO for a second material, and wherein the first material has a conduction band edge or lowest unoccupied molecular orbital (LUMO) that is higher than the corresponding conduction band edge or LUMO for the second material, the first material is a hole-acceptor with respect to the second material and the second material is an electron-acceptor with respect to the first material. A particular band edge or molecular orbital is said to be "higher" when it is closer the vacuum level.

Complementary charge-transfer properties: As used herein, a first and second semiconductor material are said to have complementary charge-transfer properties with respect to each other when the first material is a hole-acceptor with respect to the second and the second is an electron-acceptor with respect to the first or vice versa.

Nano-Architected Porous Film: As used herein "nano-architected porous film" generally refers to a film of material having features characterized by a width, or other characteristic dimension, on the order of several nanometers ($10^{-9}$ m) across. Nano-architected porous films may be produced by several techniques, including:

(a) Intercalation and/or grafting of organic or polymeric molecules within a mineral lamellar network comprised of clays, phosphates, phosphonates, etc. The lamellar compounds serve as a network host which preserves the pre-established structural order. Organic molecules are then inserted or grafted into this pre-structured network (which is comprised of mineral(s)).

(b) Synthesis by electrocrystallisation of hybrid molecular assemblies. This synthesis technique drives the construction of highly organized mineral networks with relatively long-range order that can be controlled and adjusted for electronic intermolecular transfer.

(c) Impregnation of preformed inorganic gels. In an example of this technique, a silica xerogel can be formed by hydrolysis and polycondensation of silicon alkoxides with organic monomers (e.g. with monomers that are susceptible to polymerization within the porous gel structure). Methylmethacrylate (MMA) is an example of a suitable organic monomer and the inorganic-organic hybrid obtained after polymerization of the MMA has optical and mechanical properties often superior to the individual components.

(d) Synthesis from heterofunctional metallic alkoxides metallic halides or silsesquioxannes: Precursors of this kind have the formula $R_xM(OR')_{n-x}$ or $3(R'O)Si—R''—Si(OR')3$, where R and R' are either hydrogen (H), any organic functional group or a halide, R" can be oxygen or an organic functional group, and M is a metal. Typically R and R' involve oxygen, e.g., —O—R and —O—R'. M may be any transition metal, e.g., titanium, zinc, zirconium, copper, lanthanum, niobium, strontium, or silicon, etc. The hydrolysis of alkoxy groups (OR') followed by a condensation reaction will form the mineral network and the R groups will imprint in the network the organic function.

(e) Synthesis of hybrid networks through the connection of well-defined functional nanobuilding Blocks. The preformatted species or building blocks could be in this case oxo-metallic clusters, nanoparticles (CdS, CdSe, . . . ), metallic or oxides colloids, organic molecules or oligomers. These blocks are functionalized during or after their synthesis with complementary species for tailoring the interface between organic and inorganic domains. A review of this strategy has been presented in Comments in Inorganic Chemistry 20(4-6), 327-371 (1999), which is incorporated herein by reference.

(f) Templated growth of inorganic or hybrid networks by using organic molecules and macromolecules as structure directing agents. In general, molecules like amines, alkyl ammonium ions, amphiphilic molecules or surfactants can be used as templates to build a structured mineral network. Materials of the zeolites families are among the most intensively investigated systems. Molecular and supramolecular interactions between template molecules (surfactants, amphiphilic block copolymers, organogelators, etc . . . ) and the growing hybrid or metal-oxo based network permit the construction of complex hybrid hierarchical architectures.

(g) Templated growth using nanoparticles, instead of surfactants followed by removal of the nanoparticles, leaving behind a porous network. The nanoparticles may be made, e.g., of latex, and removed, e.g., by heating the templated film to a sufficient temperature to "burn off" the nanoparticles.

Surfactant Templation: In general, surfactant templation is a particular subcategory of templated growth. As used herein, surfactant templation refers an approach toward achieving pore size control of inorganic or organic frameworks, e.g., by using surfactants or block copolymers as templates to build a structured mineral network. Surfactant temptation may be used to prepare a high-porosity surfactant-templated porous thin film. Surfactant temptation includes the sol-gel approach described below.

Optoelectronic Device: A device that interacts with radiation and electric current. Such a device could be a radiation-emitting device, e.g. a light-emitting diode (LED) or laser, or a radiation absorbing device, e.g. a photodetector/counter, photovoltaic cell (solar cell) or radiation-driven electrolysis cell.

Solar Cell: A photovoltaic device that interacts with radiation (often in the form of sunlight) impinging on the device to produce electric power or voltage.

Organic Solar Cell: A type of solar cell wherein an active photoelectric layer is fabricated, either partly or entirely, using organic materials comprising, e.g., polymers, dyes, pigments (including mixtures) that are predominantly carbon based compounds. These materials may be insulating, conductive or semiconductive.

Radiation: Energy which may be selectively applied including electromagnetic energy having a wavelength between $10^{-14}$ and $10^4$ meters including, for example, gamma radiation, x-ray radiation, ultraviolet radiation, visible light, infrared radiation, microwave radiation and radio waves.

Material: The term "material" is used herein to refer to solid-state compounds, extended solids, extended solutions, clusters of molecules or atoms, crystals, polymers, dyes, particularly including conjugated polymers and dyes.

Inorganic Materials: Materials which do not contain carbon as a principal element. The oxides and sulphides of carbon and the metallic carbides are considered inorganic materials. Examples of inorganic compounds include, but are not restricted to, the following:

(a) Intermetallics (or Intermediate Constituents): Intermetallic compounds constitute a unique class of metallic materials that form long-range ordered crystal structures below a critical temperature. Such materials form when atoms of two metals combine in certain proportions to form crystals with a different structure from that of either of the two metals (e.g., NiAl, $CrBe_2$, CuZn, etc.).

(b) Metal Alloys: A substance having metallic properties and which is composed of a mixture of two or more chemical elements of which at least one is a metal.

(c) Magnetic Alloys: An alloy exhibiting ferromagnetism such as silicon iron, but also iron-nickel alloys, which may contain small amounts of any of a number of other elements (e.g., copper, aluminum, chromium, molybdenum, vanadium, etc.), and iron-cobalt alloys.

(d) Inorganic polymers such as polysilanes or other non-carbon based polymers or monomers.

(e) Ceramics: Typically, a ceramic is a metal oxide, boride, carbide, nitride, or a mixture of such materials. Examples of such materials include, among others, alumina, zirconia, Titania ($TiO_2$) silicon carbide, aluminum nitride, silicon nitride Organic Materials: Compounds, which principally consist of carbon and hydrogen, with or without oxygen, nitrogen or other elements, except those in which carbon does not play a critical role (e.g., carbonate salts). Examples of organic materials that can be synthesized using the methods of the present invention include, but are not restricted to, the following:

(a) Organic Dyes and pigments such as perylenes, phthalocyanines, merocyanines, terylenes and squaraines and their derivatives.

(b) Polymers: Materials consisting of large macromolecules composed of more than one repeating units. Polymers, composed of 2-8 repeating units are often referred to as oligomers. Examples of such repeating units include, e.g., dyes or pigments. Polymers can be natural or synthetic, cross-linked or non-crosslinked, and they may be homopolymers, copolymers, or higher-ordered polymers (e.g., terpolymers, etc.). Examples of polymers include, but are not limited to, the following: polyurethanes, polyesters, polycarbonates, polyethyleneimines, polyacetates, polystyrenes, polyamides, polyanilines, polyacetylenes, polypyrroles, conjugated polymers, (e.g., semiconductive polymers such as polyphenylvinylene, polythiophene, polyfluorenes, polyparaphenylene and polymers containing $C_{60}$ or dyes such as perylenes or phthalocyanines) or conductive polymers such as doped PEDOT (Baytron), polyaniline or polyacetylene. These may be doped and may be synthesized or grafted onto one another using either classical organic chemistry techniques or using enzymes to catalyze specific reactions.

II. GENERAL OVERVIEW

Although the following detailed description contains many specific details for the purposes of illustration, anyone of ordinary skill in the art will appreciate that many variations and alterations to the following details are within the scope of the invention. Accordingly, the examples of embodiments of the invention described below are set forth without any loss of generality to, and without imposing limitations upon, the claimed invention.

Figure 1B:
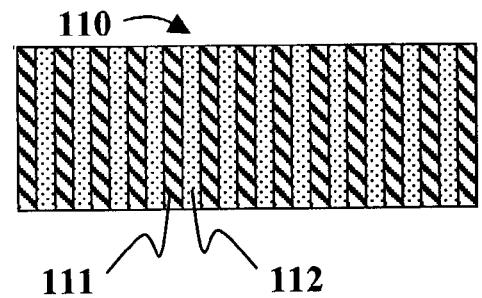
FIG. 1B depicts an exciton-splitting and charge transporting network architecture that may be fabricated according to an embodiment of the present invention.
Figure 6:
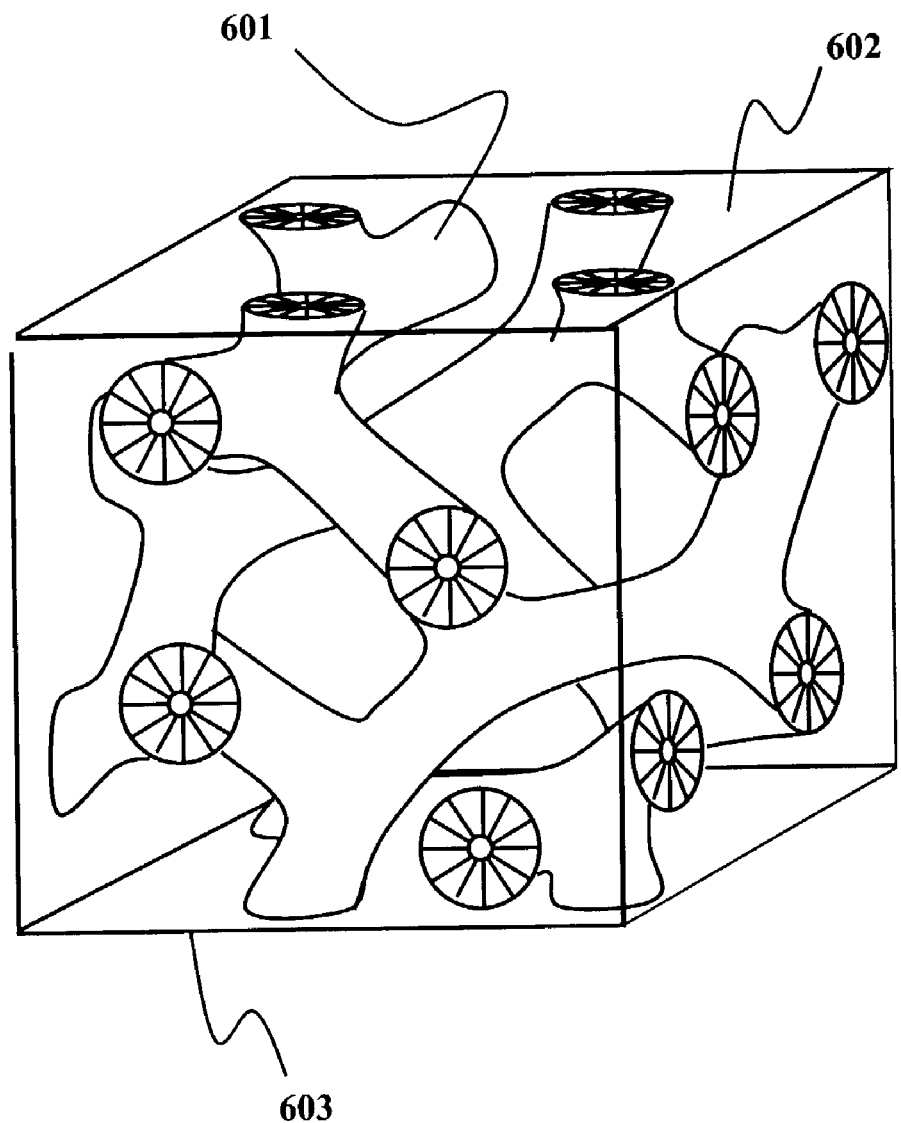
FIG. 6 depicts an isometric close-up view of a portion of a possible porous film structure.

As shown in FIG. 1A, a conventional exciton-splitting junction 100 is a flat plane, with a low interfacial surface area between a hole-transporting layer 101 and an electron-transporting layer 102. As a result of the low interfacial surface area, the junction 100 has only a modest potential for harvesting excitons. To optimize the efficiency of an exciton-splitting and charge transporting network, the interfacial surface area between the hole- and electron-accepting materials should be reachable for excitons. According to an embodiment of the present invention, this can be achieved as shown in FIG. 1B through the creation of a three-dimensional nanoscale exciton-splitting and charge transporting network. 110. The exciton-splitting and charge transporting network 110 has interpenetrating regions with complementary charge-transfer properties, e.g., an electron-transporting material 111 and hole-transporting material 112, that alternate in a substantially uniform fashion on a scale less than or equal to the exciton path length. The exciton-splitting and charge transporting network 110 is shown in simplified form for the sake of clarity. One possible variation, among others, of a configuration of an exciton-splitting and charge transporting network 110 is shown in FIG. 6.

The exciton-splitting and charge transporting network 110 may be in the form of a porous nano-architected film having interconnected pores filled with a pore-filling material, wherein the porous nano-architected film and pore filling material have complementary charge-accepting properties. The porous nano-architected film may contain regularly-spaced pores roughly 1 nm to 100 nm (more preferably 2 nm to 50 nm) in diameter where neighboring pores are between about 1 nm and about 100 nm (more preferably 2 nm to 50 nm) apart measured, e.g., from nearest edge to nearest edge. The pores are preferably interconnected with each other and accessible from any underlying layer and/or overlying layer. Such a porous nano-architected film may be a surfactant templated porous film. One approach to construct such a surfactant-templated porous film is to use sol-gel based self-assembly of porous nanofilms to construct a mold having 1-100 nm diameter pores spaced 1-100 nm apart. The pores in the porous mold may be filled with a semiconducting material. The mold may then be etched away to leave behind a semiconducting nanoscale grid network. The nanoscale grid network may be filled with a semiconducting polymer or other semiconductor material having complementary charge transfer properties with respect to the semiconducting material of the nanoscale grid network.

III. DEVICE ARCHITECTURE

According to an embodiment of the present invention, an optoelectronic device includes (1) a low-cost, highly reproducible porous nano-architected film having interconnected pores filled with (2) a pore-filling material having complementary charge-transfer properties with respect to the porous nano-architected film. The pore-filling material fills pores in the surfactant templated porous film to create an interpenetrating, nanoscale exciton-splitting and transporting network for optoelectronic devices such as photovoltaic cells. Although, examples of this embodiment are described in terms of an electron accepting porous film and a hole-accepting pore-filling material, the charge transfer properties of the porous film and pore filling material may be reversed, i.e., the porous film may be a hole acceptor with respect to the pore-filling material, which is an electron acceptor with respect to the porous nano-architected film. Such an optoelectronic device may be a photovoltaic device, such as a solar cell. Alternatively, the optoelectronic device may be a radiation-emitting device, such as an LED, laser, etc.

Figure 2:
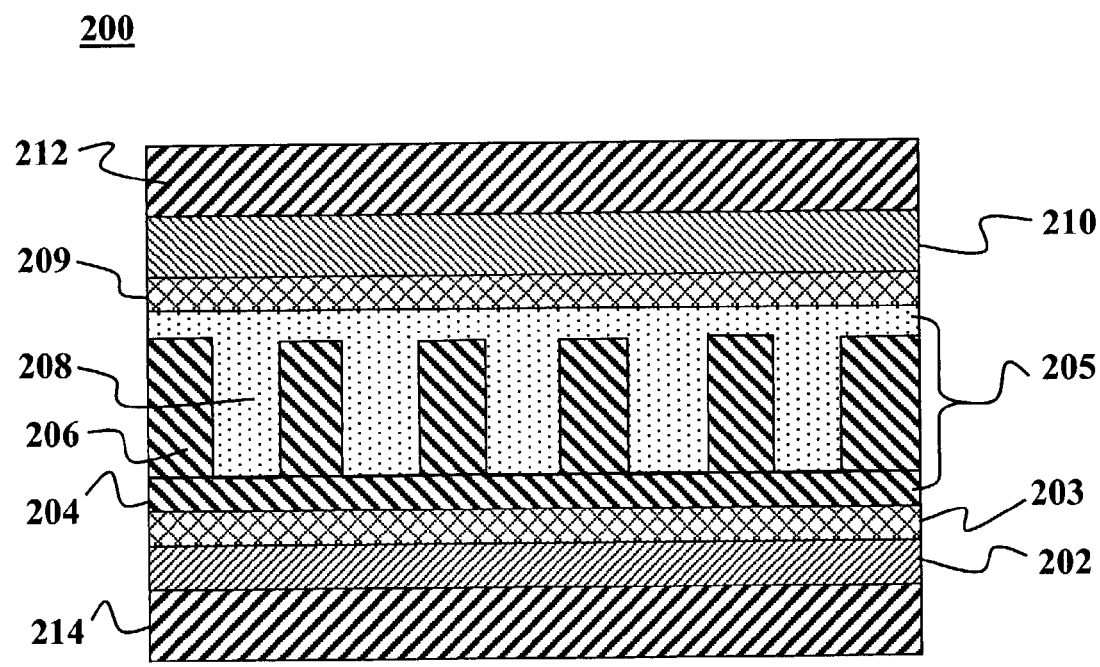
FIG. 2 is a cross-section schematic diagram of a device structure for an optoelectronic device 200 according to an embodiment of the present invention.

FIG. 2 depicts an example of a device structure for an optoelectronic device 200 according to an embodiment of the present invention. The photovoltaic cell 200 generally includes a first electrode 202, a charge-transport film 204, an exciton-splitting and charge transporting network 205 and a second electrode 210. The charge splitting network includes a nanoscale grid network 208 and a network-filling material 206. The cell 200 may optionally be protected by encapsulants 212, 214. Furthermore, a first optional interface layer 203 may be disposed between the charge transport layer 204 and the first electrode to improve charge injection into the first electrode. The interface layer 203 may also improve mechanical properties such as flexibility and resistance to short circuits. A similar second optional interface layer 209 may be disposed between the nanoscale grid network 208 and the second electrode 210.

The first electrode 202, which may serve as a base for the device 200, may be in the form of a commercially available sheet material such as such as C-, Au-, Ag-, Al-, or Cu-coated Steel Foil. The charge transport film 204 and the network filling material 206 and may both be composed of the same material, e.g., an hole-accepting material such as a conjugated polymer or an oxide, such as copper oxide. Alternatively, the charge-transport film 204 may be made from different materials. The material used in the network-filling material 206 and/or charge transport film 204 may be altered to optimize its radiation absorption and/or charge transport properties, e.g., through carbon or hydrogen doping. The charge-transport film 204 provides electrical contact between the network-filling material 206 and the substrate electrode 202.

The nanoscale grid network 208 contains substantially uniformly distributed, e.g., regularly spaced, structures roughly 1 nm to 100 nm in diameter and more preferably, about 5 nm to about 15 nm in diameter. In general, neighboring structures are between about 1 nm and about 100 nm apart measured, e.g., from nearest edge to nearest edge. More preferably, the pores are between about 5 nm apart and 15 nm apart, edge to edge. Where organic semiconductors are used for either the nanoscale grid network 208 or the network-filling material 206, it is desirable for the size and spacing of the pores to be on the order of the exciton diffusion length in the respective organic semiconducting material. The substantially uniform distribution of the pores enhances the overall conversion efficiency of the photovoltaic cell 200.

The exciton-splitting and charge transporting network 205 is shown in simplified form for the sake of clarity. Although the pores in the exciton-splitting and charge transporting network 205 may be aligned substantially parallel to each other as shown in FIG. 2, the pores may also be interconnected and, most importantly, accessible from both neighboring layers, e.g. electrodes 202, 210 or interface layers 203, 209. One possible variation, among others, of a possible configuration of the pores in an exciton-splitting and charge transporting network is shown in FIG. 6.

The network-filling material 206 fills the spaces between the structures in the nanoscale grid network 208. The network-filling material 206 has complementary charge-accepting properties with respect to the nanoscale grid network 208. The optional charge-transport film 204 inhibits or prevents direct contact between nanoscale grid network 208 and the substrate electrode 202. The nanoscale grid network 208 may cover the network-filling material 206 in such a way as to inhibit direct contact between the network-filling material 206 and the second electrode 210. By way of example, and without loss of generality, where the nanoscale grid network 208 may be made from an electron-accepting material, e.g., Titania, ($TiO_2$) zinc oxide ($ZnO_2$), zirconium oxide, lanthanum oxide, niobium oxide, tungsten oxide, strontium oxide, calcium/titanium oxide, sodium titanate, potassium niobate, Cadmium Selenide (CdSe), Cadmium Sulfide (CdS), or Cadmium Telluride (CdTe) as well as blends of two or more such materials such as $TiO_2/SiO_2$ blends/hybrids.

The network-filling material 206 may be a semiconducting, e.g., hole-accepting, organic material. In the case of a complementary structure, the network-filling material 206 may be an electron-accepting organic material. Examples of suitable semiconducting organic materials include conjugated polymers such as poly(phenylene) and derivatives thereof, poly(phenylene vinylene) and derivatives thereof (e.g., poly(2-methoxy-5-(2-ethyl-hexyloxy)-1,4-phenylene vinylene (MEH-PPV), poly(para-phenylene vinylene), (PPV)), poly(thiophene) and derivatives thereof (e.g., poly (3-octylthiophene-2,5,-diyl), regioregular, poly(3-octylthiophene-2,5,-diyl), regiorandom, Poly(3-hexylthiophene-2,5-diyl), regioregular, poly(3-hexylthiophene-2,5-diyl), regiorandom), poly(thienylenevinylene) and derivatives thereof, and poly(isothianaphthene) and derivatives thereof. Other suitable semiconducting polymers include organometallic polymers, polymers containing perylene units, poly (squaraines) and their derivatives. Other suitable semiconducting pore-filling materials include organic pigments or dyes, azo-dyes having azo chromofores (—N=N—) linking aromatic groups, phthalocyanines including metal-free phthalocyanine; (HPc), perylenes, naphthalocyanines, squaraines, merocyanines and their respective derivatives, poly(silanes), poly(germinates), 2,9-Di(pent-3-yl)-anthra[2,1,9-def:6,5,10-d'e'f']diisoquinoline-1,3,8,10-tetrone, and 2,9-Bis-(1-hexyl-hept-1-yl)-anthra[2,1,9-def:6,5,10-d'e'f'] diisoquinoline-1,3,8,10-tetrone.

Alternatively, the network-filling material 206 may be a hole-accepting inorganic material, such as copper oxide or an electron-accepting inorganic material in the case of a complementary structure. Furthermore, the network-filling material 206 may be a combination of two or more compounds, e.g., solubilized buckminsterfullerene ($C_{60}$) and/or a dye, such as perylene and/or a polythiophene derivative. The combination of the electron-accepting nanoscale grid network 208 and the hole-accepting network-filling material 206 creates a nanoscale, high-interfacial area exciton-splitting and charge transporting network 205.

The second electrode 210 provides an electrical connection to the nanoscale grid network 208. Preferably, the substrate electrode 202, the second electrode 210 or both electrodes 202, 210 are made from a material that transmits radiation of interest to the photovoltaic process that takes place within the cell 200. Examples of suitable transparent conducting materials for the electrodes 202, 210 include conductive transparent oxides such as doped tin oxide ($SnO_2$) and indium-tin oxide (ITO).

The optional interface layers 203, 209 may be made from conducting polymers, such as PEDOT or polyaniline. Alternatively, the interface layers 203, 209 may include a material, such as lithium fluoride (LiF) that improves charge injection into the electrodes 202, 210 or smoothes out the surface roughness of the electrodes 202, 210.

The optional encapsulants 212, 214 protect the cell 200 from the surrounding environment. Examples of suitable encapsulant materials include one or more layers of polymers, such as polyethylene terephthalate (PET) and/or Mylar®. Mylar is a registered trademark of E. I. du Pont de Nemours and Company of Wilmington, Del. Inorganic materials, such as glass and metal foils may also be used for the encapsulants 212, 214. Ethylene vinyl acetate (EVA) may be used in either case in conjunction with the other encapsulant. The encapsulants 212, 214 may also include nitrides, oxides, oxynitrides or other inorganic materials that protect against exposure to water or air. The encapsulants 212, 214 may also absorb UV-light to protect organic materials disposed between the encapsulants 212, 214.

There are many possible variations on the basic photovoltaic cell described in the example above. For example, the nanoscale grid network 208 may be made from metal oxides, other than $TiO_2$, or blends of metal oxides, or blends of $TiO_2$ and $SiO_2$ precursor materials or other semiconducting compounds that are capable of accepting electrons from the network-filling material 206 and transporting the electrons. Furthermore, the nanoscale grid network 208 may be made from metal oxides or other semiconductor compounds (e.g., conjugated polymers or dyes) that are hole-acceptors with respect to the network-filling material 206. One example, among others, of such a semiconductor material is copper oxide (CuO). In such a case, the network-filling material 206 would be an electron accepting material with respect to the material of the nanoscale grid network 208.

III. FABRICATION OF PHOTOVOLTAIC DEVICES

Exciton-splitting and charge transporting networks of the types described above and optoelectronic devices of the type depicted in FIG. 2 may be manufactured in accordance with an inventive method. An example of an embodiment of such a method is 300 illustrated by the flow diagram of FIG. 3 and the series of schematic diagrams shown in FIGS. 4A-4F.

Figure 4A:
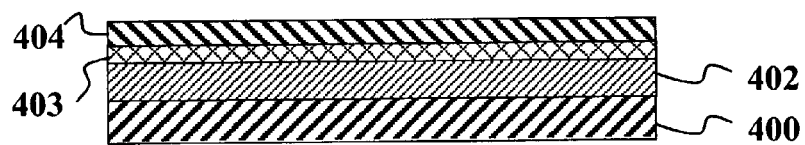
FIGS. 4A-4H depict a series of schematic diagrams illustrating the fabrication of a photovoltaic cell according to the flow diagram of FIG. 3.
Figure 4B:
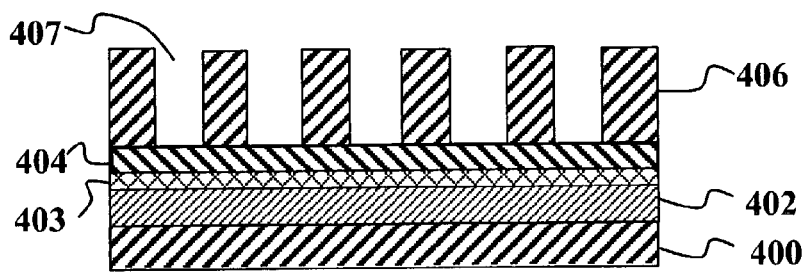

The method 300 may begin at 301 by optionally depositing a first electrode 402, e.g. indium-tin-oxide (ITO) on a substrate 400, e.g. glass or PET (Mylar). At 302 a first interface layer 403 may optionally be formed on the first electrode 402. At 303 an optional first charge-transport film 404 may be formed on either the first electrode 402 or the first interface layer 403 as shown in FIG. 4A. Alternatively, a commercially available sheet material such as such as Au-, Ag-, Al-, C- or Cu-coated Steel Foil may be used as the first electrode 402 and/or substrate 400. The first charge transport film 404 may be a hole-accepting material such as any of those materials described above with respect to network-filling material 206. Subsequently, at 304, a porous nano-architected template film 406 having pores 407 is formed on the first charge-transport layer 404 as shown in FIG. 4B. Such as a film may be formed, e.g., by surfactant temptation techniques. The configuration of the pores 407 is shown in simplified form for the sake of clarity. Although the pores 407 may be aligned substantially parallel to each other as shown in FIGS. 4B-4F, the pores 407 are preferably interconnected and accessible from both neighboring layers, e.g. electrodes or interface layers. One example, among others, of a possible configuration of the pores 407 is shown in FIG. 6.

Figure 4C:
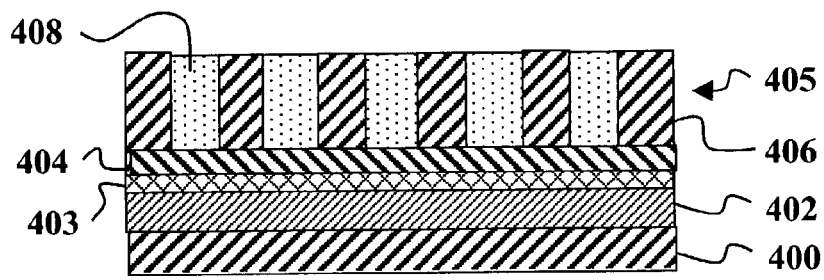

In particular, the template film 406 may be made from oxides, such as silica ($SiO_2$). Alternatively, other metal oxides, such as Titania ($TiO_2$) may be used. The template film 406 may be a made using a variety of surfactant temptation techniques such as evaporation induced self-assembly, etc. Precursors for the template film 406 may be coated on the first 402, e.g. by web-coating, dip-coating, spin-coating or spray coating based deposition. By appropriate choice of the coating parameters, the porous template film 406 can be formed such that the pores 407 are roughly 2 nm to 100 nm in diameter and neighboring pores are between about 2 nm and about 100 nm apart. The porous template film 406 is dried, annealed and, at 306, the pores 407 are then filled with a semiconducting pore-filling material 408, as shown in FIG. 4C. The pore-filling material 408 may be made of the materials described above the nanoscale grid network 208 of FIG. 2. The pore-filling material may be deposited in the pores by any suitable technique, including electrodeposition or chemical bath deposition. In a particular embodiment, the pore-filling material 408 may be $TiO_2$, Copper Oxide, $ZnO_2$, $ZrO_2$ lanthanum oxide, niobium oxide, tungsten oxide, strontium oxide, calcium/titanium oxide, sodium titanate and potassium niobate, CdSe, CdS, or CdTe or blends of two or more such materials electrodeposited in a porous $SiO_2$ template film.

Figure 4D:
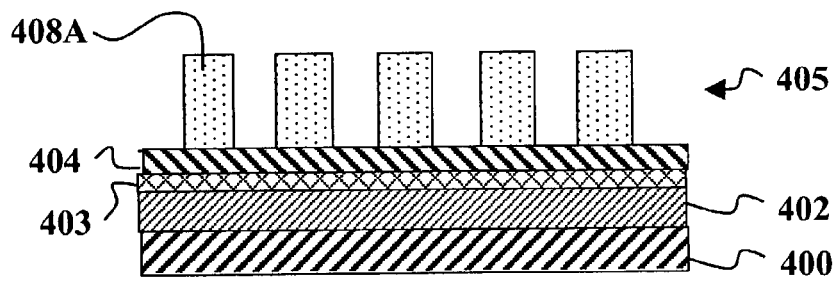

At step 308 the porous template film 406 is removed, as shown in FIG. 4D, e.g., by chemical etching in a solution of sodium hydroxide (NaOH), potassium hydroxide (KOH), or hydrofluoric acid (HF), without removing the pore-filling material 408. In a preferred embodiment, the porous template film 406 may be removed by etching in a solution of 5 M-10 M NaOH with suitable washing of any debris of $SiO_2$. The removal of the porous template film leaves behind nanoscale grid network 405 having structures 408A made from the pore filling material 408 that have essentially the same size and shape as the pores 407. The structures 408A in the nanoscale grid network 405 are separated by spaces 407A left by the removal of the porous template film 406.

Figure 4E:
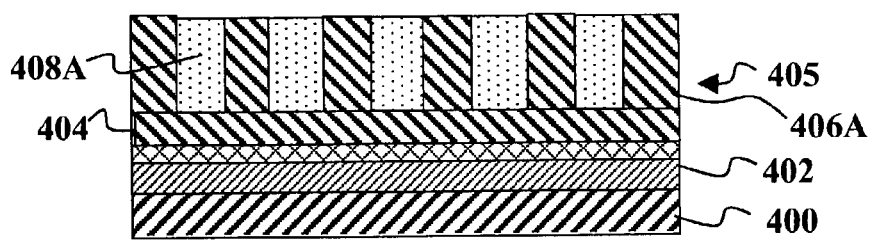

A 310 a network-filling material 406A fills the spaces 407A in the nanoscale grid network 405, as shown in FIG. 4E. The network filling material 406A has complementary charge transfer properties with respect to the structures 408A, i.e., with respect to the pore-filling material 408. By way of example, if the pore filling material 408 and structures 408A are made of an electron-accepting material such as Titania, CdSe, CdS, or CdTe, the network-filling material 406A may be a hole-accepting organic material, including conjugated polymers or dye such as thiophene, polythiophene, or phthalocyanine, poly phthalocyanine or a hole-accepting inorganic material, such as copper oxide. For a complementary structure, i.e., where the pore-filling material 408 is a hole-acceptor, the network filling material 406A may be as suitable electron-acceptor. The combination of the network-filling material 406A and the nanoscale grid network 405 creates a nanoscale, high-interfacial area exciton-splitting and transporting network layer.

Figure 4F:
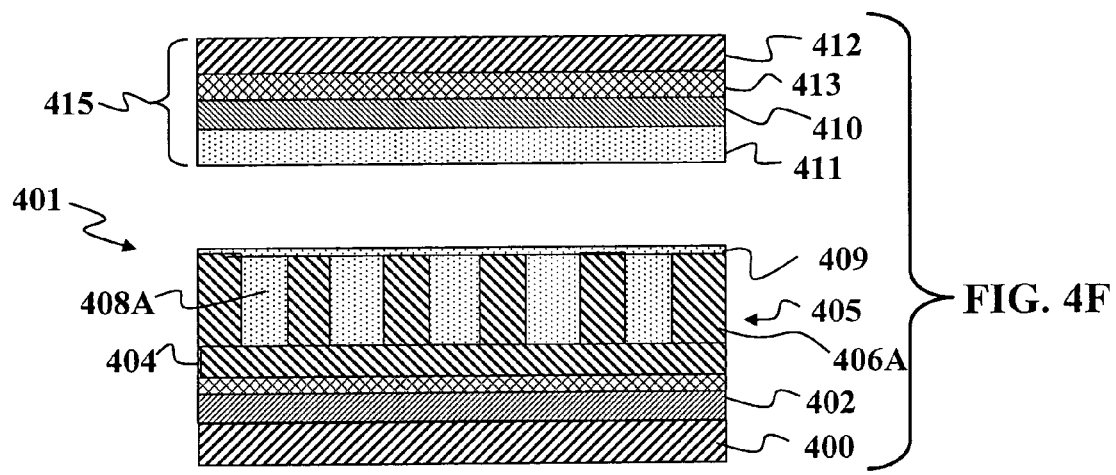

At 312, a second charge-transport film 409, may optionally be applied to the exposed surface of the nanoscale grid network 405 as shown in FIG. 4F. In general, the second charge transport film 409 may be made of any of the materials suitable for the pore-filling material 408, e.g., as described above. At 314, the nanoscale grid network 405 is then put in electrical contact with second electrode 410, (which may be formed at 315) e.g. via the second charge-transport film 409. For example, the substrate 400, first electrode 402, nanoscale grid network 405, network-filling material 406A, etc., may comprise one section 401 of a photovoltaic device shown in the lower portion of FIG. 4F.

Figure 4G:
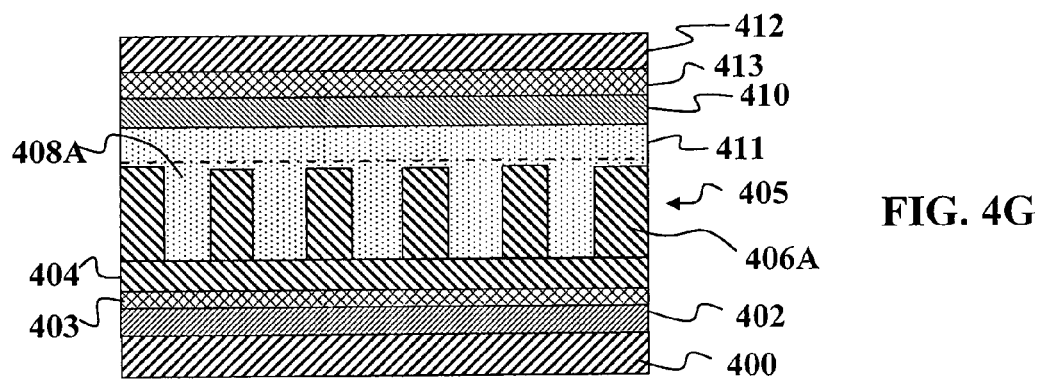

A second section 415, shown in the upper portion of FIG. 4F, may be built using a commercially-available sheet material 412, for example, a metal, such as steel or aluminum, which may be coated with a second material to enhance or optimize the work function of the second electrode 410. Alternatively, Mylar (Polyethylene Terephthalate, PET) may be used as a sheet material 412 for transparent substrate. The sheet material 412 may be coated with a transparent conducting material (e.g. a layer of tin oxide or indium tin oxide) to form the second electrode 410. An optional second interface layer 413 may be applied to the second electrode 410. An optional layer of charge-transport material 411 may be applied to the transparent second electrode 410 or the second interface layer 413 to complete the second section 415. The optional layer of charge transport material 411 may be made from the same type of material as the second charge transport film 409. The first and second sections 401, 415 may then be laminated together at the homo-junction (dashed lines) between the second charge transport film 409 and the charge transport material layer 411, as shown in FIG. 4G.

In an optional step 316 the resulting device may be encapsulated. For example, an encapsulant layer 414 may cover the exposed surface of the first electrode 402 as shown in FIG. 4F. Alternatively, the first electrode 402 may be mounted to the encapsulant layer 414 prior to forming non porous film 404 or the porous film template 406. Note that in this example, the sheet material 412 also may be used as an encapsulant layer.

The key steps in the method 300 are forming the porous template film (304) and filling the pores in the porous film with pore-filling material (306), removing the porous template film to form the nanoscale grid network (308) washing out any remaining debris, and filling the nanoscale grid network (310). Some approaches to accomplishing these two steps along with approaches to other steps in the method 300 are discussed in detail below.

A. Fabrication of Porous Template Film

Figure 3:
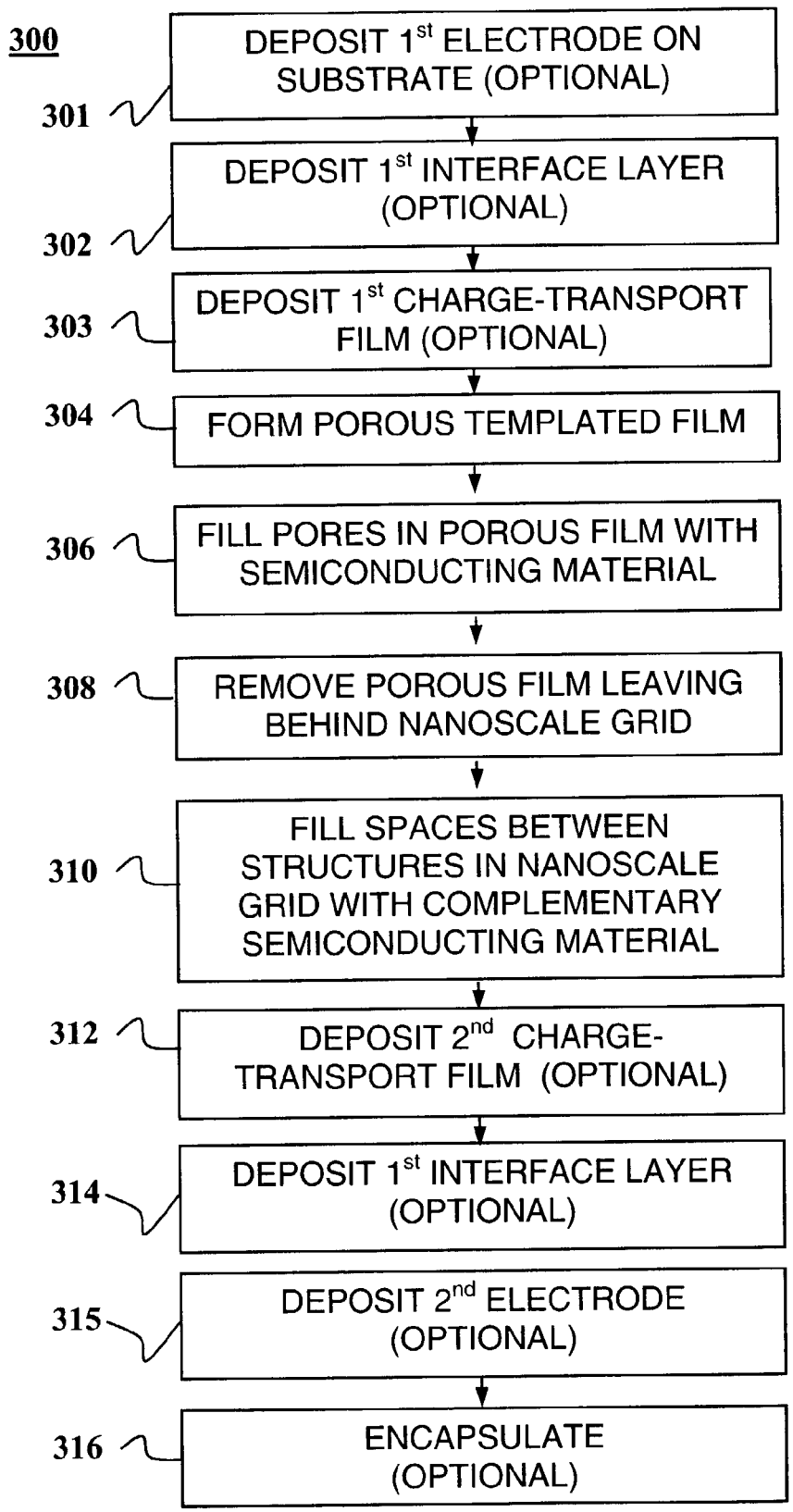
FIG. 3 depicts a flow diagram illustrating an example of a method for making a photovoltaic device of the type shown in FIG. 2 according to an embodiment of the present invention

With respect to step 304 if FIG. 3, there are several approaches to forming the porous nano-architected film described above. One such approach, among others, involves templated growth of inorganic or hybrid networks, e.g., by surfactant temptation.

Examples of surfactant-templation techniques for producing porous films are described, e.g., by Brinker, et al in U.S. Pat. No. 6,270,846, the disclosures of which are incorporated herein by reference. One particular surfactant-templation approach, among others, utilizes evaporation-induced self-assembly (EISA) to form a meso-organized liquid-crystal template. This process has been well developed for the fabrication of porous silica, where the substrate is first coated with siloxane and surfactants in an ethanol solution. As the ethanol evaporates over a short time (typically 60-120 seconds), the molecules within the siloxane-surfactant micelle rearrange themselves to minimize their collective energy level. This process continues as the molecules further rearrange their nanoscale organization into highly regular liquid-crystalline mesophases. The resulting porous films contain a high and tunable density of regular, interconnected pores spaced in repeating patterns, with pores neighboring pores spaced approximately 5 nm apart and with pore diameters of about 5 nm, dependant on the choice of surfactant. This nanoscale architecture is highly reproducible, and can be permanently fixed by heating. The resulting nanofilm is extremely stable and mechanically robust. Pore diameter and pore spacing may be adjusted by (1) choice of surfactant, (2) concentration of surfactant, (3) the use of block co-polymers, (4) temperature, (5) humidity level, (6) deposition procedure and speed, (7) concentration of siloxane, (8) use of a cosolvent, (9) use of swelling agents or some combination of two or more of (1), (2), (3), (4), (5), (6), (7), (8) and (9).

Figure 5:
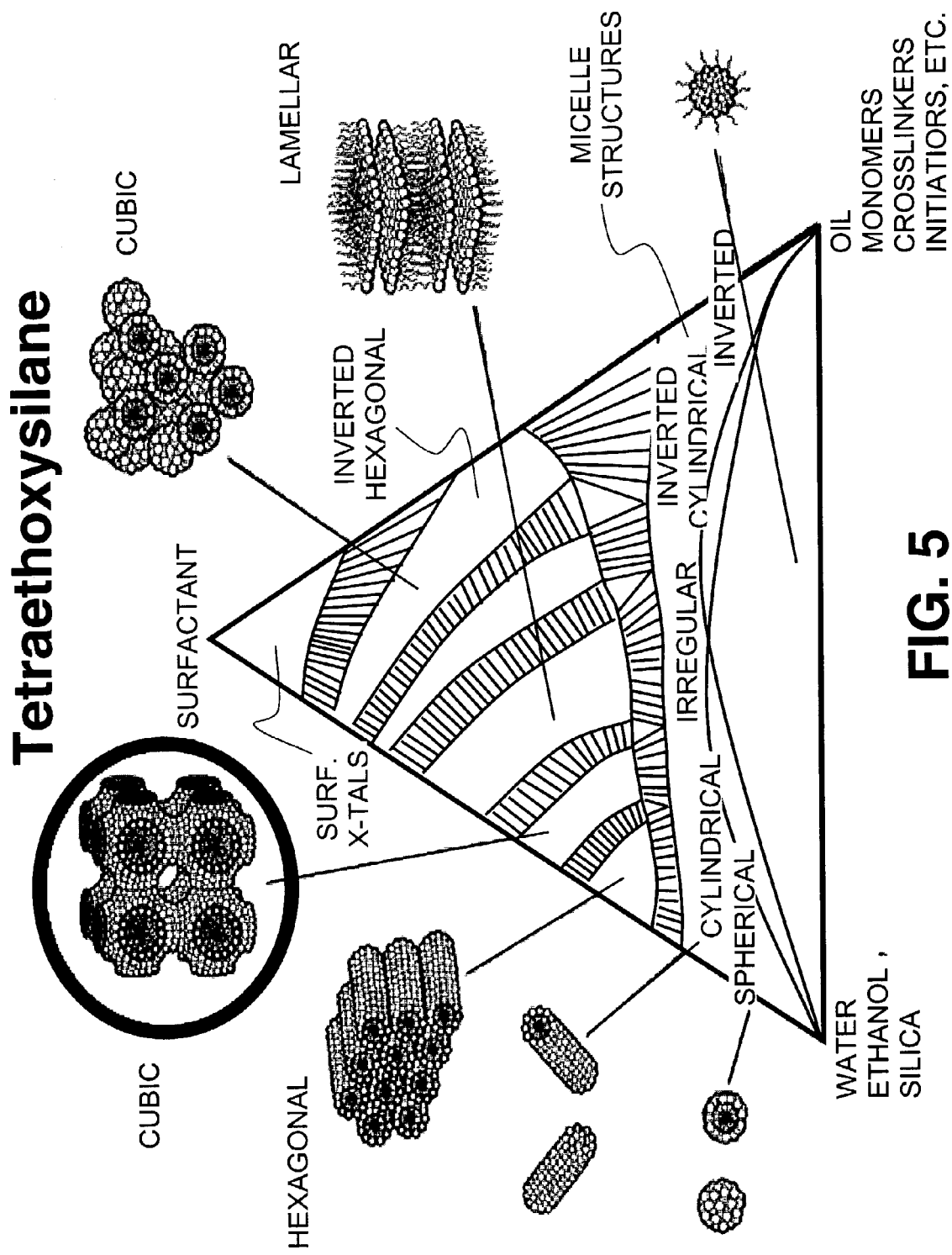
FIG. 5 depicts a ternary phase diagram representing the synthesis of a variety of architectures within a porous film.

FIG. 5 depicts a ternary phase diagram representing the formation of a variety of architectures within a porous film. The structure circled in FIG. 5 depicts a simplified and somewhat idealized desirable morphology for the porous template film. A possible variation of this morphology is shown in FIG. 6, which depicts a portion of a surfactant-templated porous film 600. The film 600 has numerous pores 601 that are interconnected with each other. Furthermore, the pores 601 provide a continuous path, through one or more pores, between a first surface 602 and a second surface 603. The path through the pores 601 provides access to the pores from a layer overlying or a layer underlying the surfactant-templated porous film 600. When the pores are filled with a semiconducting pore-filling material, charges have a path to migrate through the pore filling material from the overlying layer to the underlying layer and/or vice versa.

In one embodiment, among others, the porous template film is fabricated using a precursor sol. To synthesize the sol, mixtures of one or more alkoxides, one or more surfactants one or more condensation inhibitors, water, and ethanol are combined. In one embodiment, among others, the surfactant is a molecule wherein n is 20 and m is 70.

Examples of suitable alkoxides include polysiloxanes such as tetraethylorthosilicate (TEOS). Examples of suitable surfactants include $HO(CH_2CH_2O)_n(CH_2CHCH_3O)_m(CH_2CH_2O)_nH$, where the subscripts m and n are integers. A particular surfactant of this type is the block copolymer poly(ethyleneoxide)-b-poly(propyleneoxide)-b-poly(ethyleneoxide) (EO20-PO70EO20), sometimes known commercially as Pluronic P123. For Pluronic P123, n=20, m=70, n=20 and the nominal molecular weight is 5750 g/mol. Other suitable surfactants include hexadecyl trimethylammonium bromide (CTAB), polyoxyalkylene ether (e.g. Pluronic F127), and poly(oxyethylene) cetyl ether (e.g., Brij56 or Brij58) Pluronic is a registered trademark of BASF Corporation of Ludwigshafen, Germany. Brij is a registered trademark of Atlas Chemicals of Wilmington Del.

For Pluronic F127, which is a triblock copolymer (PEO-PPO-PEO, having an n-m-n ratio of EO97PO69EO97, i.e., n=97, m=69, n=97. The nominal molecular weight for Pluronic F127 is 12,600 g/mol. F127 is a difunctional block copolymer surfactant terminating in primary hydroxyl groups. It is a nonionic surfactant.

Brij 56 is polyoxyethylene 10 cetyl ether. Brij 58 has several synonyms, including poly(oxyethylene) cetyl ether, poly(oxyethylene) palmityl ether, polyethylene oxide hexadecyl ether, and polyethylene glycol cetyl ether.

Examples of suitable condensation inhibitors include acids such as hydrochloric acid (HCl), sulfuric acid ($H_2SO_4$), nitric acid ($HNO_3$), etc., bases such as sodium hydroxide (NaOH), triethylamine, etc., and chelating agents, including acetyl acetone, alcohol amines, peroxides, etc.

Generally speaking, the molar ratios of the surfactant, condensation inhibitor, ethanol and water may be in the following ranges with respect to X, where X refers to the central element or inorganic network atom, e.g., Ti, Zr, Zn, Si, etc. in the alkoxide:

[Surfactant]/[X]: a molar ratio ranging from about $1 \times 10^{-7}$ to about 0.1

[Ethanol]/[X]: a molar ratio ranging from about 3 to about 20

[Condensation Inhibitor]/[X]: a molar ranging ratio from about $1 \times 10^{-5}$ to about 5

[water]/[X]: a molar ratio ranging from about 1 to about 20.

By way of example, a precursor sol for a porous template of $SiO_2$ may be prepared from TEOS, a polar organic solvent, water and an acid, a hydrophobic compound such as polypropylene oxide (molecular weight of approximately 2000) and a surfactant, such as a polyoxyethylene ether or P123. The polar organic solvent can be any solvent that solubilizes the other reactants, particularly such solvents as alcohols, and more particularly, methanol, ethanol, propanol, butanol, tetrahydrofuran, and formamide or mixtures thereof. An initial silica sol may be prepared by refluxing TEOS, ethanol, water and an acid, such as HCl, at approximately 60° C. By way of example, the molar ratio of the TEOS, ethanol and acid may be about $1:3.8:1.5 \times 10^{-5}$. The sol may be cooled to room temperature and surfactant, $CH_3(CH_2)_{15}(OCH_2CH_2)_{10}OH$, in amounts ranging from 0.6 g to 1.0 g, and the polymer, polypropylene oxide (PPO), in amounts ranging from approximately 0 g to 1.2 g, may be added to 5 mL of the sol, along with 0.8 mL of 1N HCl. The sols may be filtered and a thin film prepared from this solution by spin-coating, web-coating, dip-coating, spray-coating, ink-jet printing, etc. onto a substrate. During the coating procedure, evaporation of the solvent causes the formation of surfactant-stabilized polypropylene microemulsions incorporated into a surfactant-templated silica material. The as-coated films must be crosslinked to form a mesoporous grid and may be heated to approximately 400° C. to 450° C. for approximately 3 hours to remove surfactant and polypropylene oxide templates. Incubation temperature, ramp rate and total incubation time may be varied to optimize the properties of the film.

After incubation of the sol mixture, a substrate, e.g., the first electrode 402 (e.g., ITO-coated glass or PET), is dipped in the mixture and removed e.g., using an automated, custom-built dip coating apparatus or a commercially available web coating system. Upon removal from the sol, preferential ethanol evaporation concentrates the sol in water, non-volatile surfactant, and the TEOS component thereby forming a $SiO_2$ surfactant-templated porous film. The progressive increase in surfactant concentration drives the self-assembly of metal-alkoxide-surfactant micelles and their further organization into liquid-crystalline mesophases.

The highly-ordered structure of the resulting liquid crystallites can be permanently fixed through exposure to heat. After pattern deposition and drying, the surfactant templates can be selectively removed by annealing the surfactant templated porous film at a temperature (e.g., about 170° C. to about 400° C.) that is sufficient to covalently crosslink the mesoporous matrix and/or is sufficient to decompose the surfactant molecules while remaining within the thermal stability range of the underlying ITO-coated glass or ITO-coated Mylar substrate. The annealing time depends, partly, on the annealing temperature. In general, the high the temperature, the shorter the time and vice versa. An annealing temperature of about 250° C. or higher is preferable as this temperature serves both to covalently cross-link the matrix and to pyrolyze the surfactant out of the matrix within a relatively short time. Once the sol has been cross-linked to itself and the substrate, any remaining surfactant may be removed by heating at more than about 350° C. or by soaking the substrate in ethanol or another appropriate solvent. Alternatively, the film may be annealed for a shorter time at a higher temperature or for a longer time at a lower temperature. Furthermore, either as an alternative to annealing, or in conjunction with annealing, the surfactant template may be exposed to energetic radiation, such as ultraviolet (UV) radiation, to facilitate crosslinking of the grid to form a mesoporous grid and to destroy the structure of the surfactant and make it easier to wash out.

The annealing preferably occurs before the deposition of any semiconducting material, e.g. electron-accepting material such as $TiO_2$, CdSe, CdS, CdTe, etc., into the porous template film (step 306 discussed below), as it is this initial step that creates the porous structure. Thus any semiconducting material to be deposited in a later step will not be affected by the annealing of the porous Titania film in this prior step.

For photovoltaic applications, it is desirable to create uniform films with regularly spaced pores having diameters of between about 1 nm and about 50 nm diameters, most preferably about 4 to 10 nm. The properties of the porous film 406, e.g., pore size and surface area, may be confirmed by $N_2$ gas adsorption isotherms. Such isotherms may be obtained, e.g., at −196° C. using a Beckman Coulter SA 3100 Surface Analyzer. Gas adsorption is considered an accurate method for determining surface area and pore size in the 2-200 nm range. In this measurement technique, inert gas molecules ($N_2$) are physisorbed onto the surface at a constant temperature, and the amount of gas adsorbed as a function of pressure is recorded as the adsorption isotherm. Monolayer formation on the sample by $N_2$ adsorbate occurs due to favorable adsorbate-adsorbent energies and enables BET (Brunauer, Emmett, Teller) surface area calculation. Multilayer formation occurs preferentially in the pores as a result of capillary adsorbate-adsorbate condensation and enables pore volume/size determination prior to bulk adsorbate-adsorbate interaction and condensation.

Figure 7:
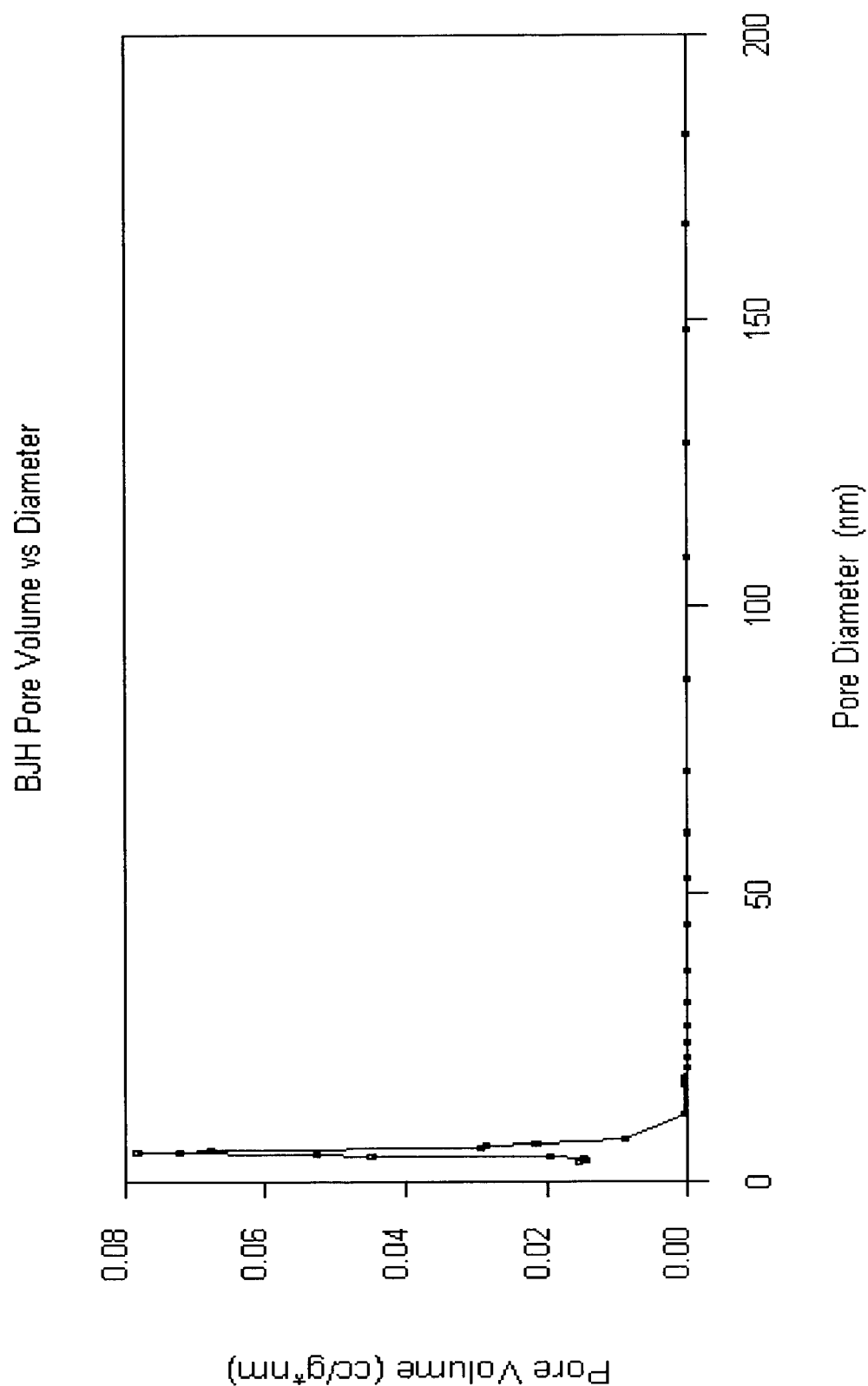
FIG. 7 depicts a graph of pore area vs. pore diameter for F127 templated polysiloxane porous film.

FIG. 7 shows data depicting the distribution of pore sizes in porous films created using the protocol described above. The graph in FIG. 7 plots pore area vs. pore diameter for a F127 templated polysiloxane porous film. Solutions containing F127 surfactant and polysiloxane were dropcast, dried, and annealed at 400° C. for two hours. A porous matrix covering a lateral surface area of 78.5 cm$^2$ was scraped off and placed in a sample chamber for surface analysis. Data was acquired using a Beckman Coulter SA 3100 surface analyzer using liquid nitrogen; samples were analyzed using the BET and BJH algorithms. A narrow distribution of pore sizes clustered around 6 nm shows that the pore structure is relatively uniform within the film, and that this structure can be successfully measured using $N_2$ adsorption isotherms.

Figure 8A:
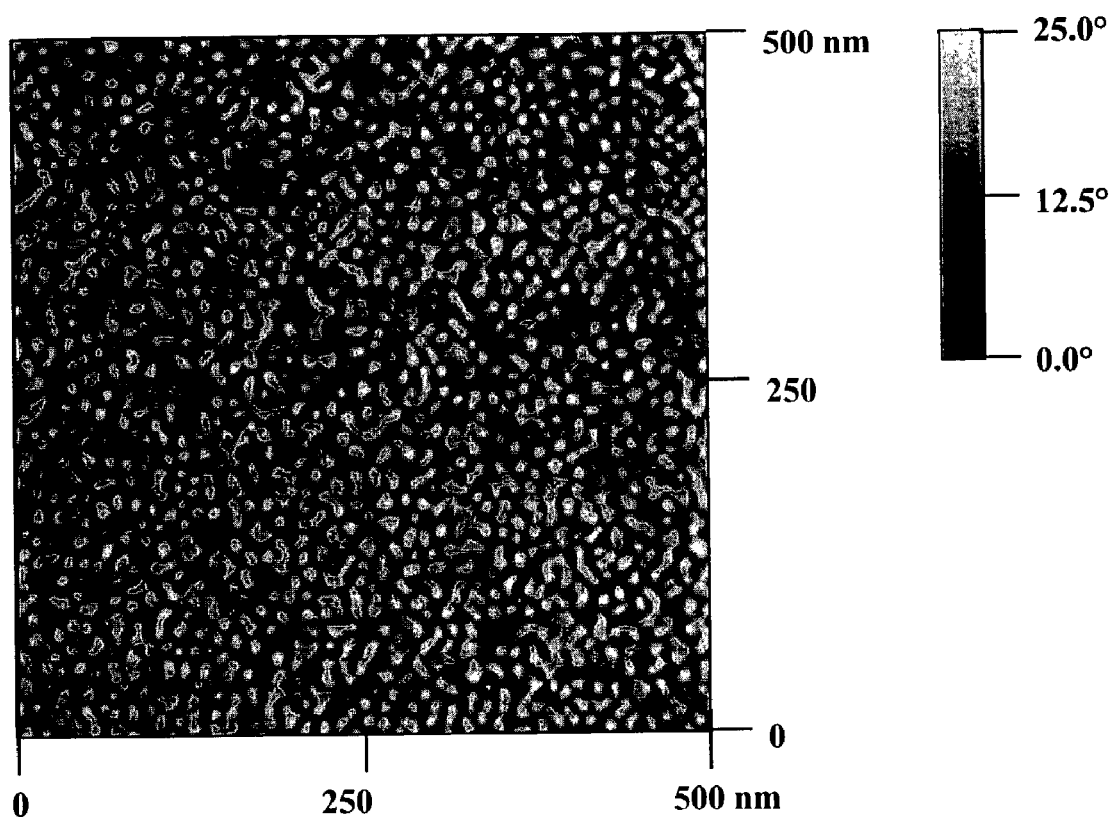
FIGS. 8A-8B depict atomic force micrographs of an example of a surfactant-templated porous film suitable for use with embodiments of the present invention.
Figure 8B:
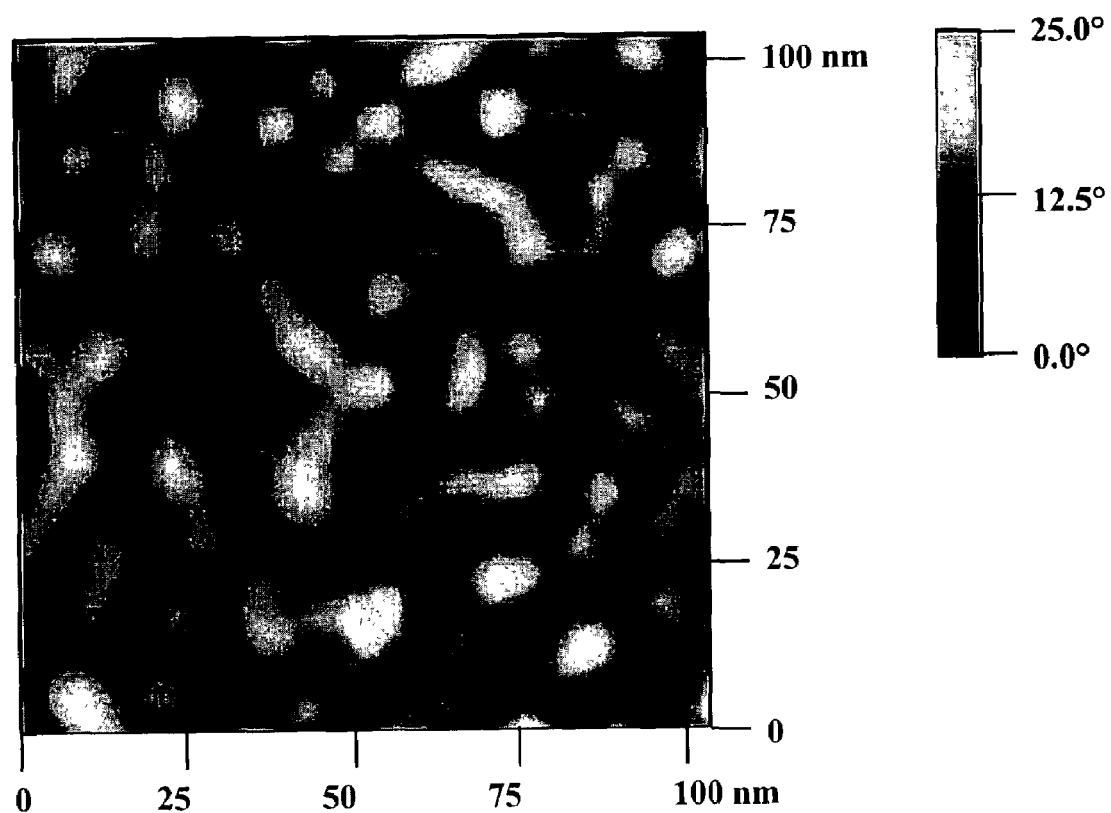

Alternatively, Atomic Force Microcopy (AFM) can be used to directly measure the sizes, orientations, and distributions of the pores in the porous film 306, and to monitor the two-dimensional orientation of both inorganic and organic crystals, to characterize the surface roughness data of all films including the scratches and other defects. FIGS. 8A-8B depict atomic force micrographs of an example of a surfactant-templated porous film manufactured using techniques of the type described above. In this particular example, a porous film of $SiO_2$ was formed on a F:$SnO_2$ coated glass substrate using a sol mixture containing TEOS, Pluronic P123 as a surfactant, HCl as a condensation inhibitor, water and ethanol. The sol was filtered and a thin film was prepared from this solution by dip-coating onto a glass substrate. Prior to dip-coating, the substrate was cleaned and then dried by rinsing with isopropyl alcohol (EPA). FIGS. 8A-8B show phase contrast images, taken in tapping mode, of a nano-structured $SiO_2$ surface with features of about 10 nm diameter. The images have been modified to reduce noise and enhance contrast. Phase contrast is associated with changes in the viscoelastic properties. For example, small phase, indicated by the darker areas of the images, typically indicates the presence of a soft material. A relatively large change in phase, indicated by the lighter shaded areas in the images, may be associated with the presence of pores filled with air.

Although the forgoing embodiment utilizes a porous template film of $SiO_2$, alternative embodiments may use other metal alkoxides to produce mesoporous matrices made from materials other than $SiO_2$, e.g., $TiO_2$, $ZrO_2$, ZnO, etc. that are amenable to etching. Furthermore, blends of two or more alkoxides with different central elements, e.g., Si, Ti, Zr, Zn, etc., may be used in precursor sols to produce porous template films made from blends of two or more different oxide materials such as $SiO_2$, $TiO_2$, $ZrO_2$, ZnO, etc.

B. Filling Pores in Porous Template Film

As described above with respect to step 306, after construction of the surfactant-templated porous $SiO_2$ film 406, the pores 407 within the porous film 406 are substantially filled with a semiconducting pore-filling material 408 such as Titania ($TiO_2$) Zirconia ($ZrO_2$), ZnO, CdSe, CdS, CdTe, CuO or any of the other materials described above with respect to nanoscale grid network 208. For example, semiconductor nanoscale grid networks comprised of CdSe, CdS, Titania (TiO$_2$) Zirconia (ZrO$_2$), ZnO, CuO and/or CdTe materials can be deposited into the pores 407 in the porous template film 406, e.g., using standard electrodeposition or chemical bath deposition techniques. In a particular embodiment, the pore 407 can be filled by electrochemically growing metal or semiconductor within the pore channels of the porous template film 406. For example, a porous silica thin film may be coated onto a transparent conductive substrate such as SnO$_2$, F:SnO$_2$, or ITO, whose surface serves as a working electrode. Electrodeposition drives the growth of a metal or semiconductor material within the pore channels from the bottom conductive surface upward towards the top of the pore channels. The silica template may then be removed via standard wet-etching techniques, resulting in an ordered nanoscale grid network with an interconnective pore structure that replicates (in the inverse form) the original template of the silica framework structure.

As used herein, the term "substantially filled" generally means that the pore-filling material 408 fills a significant volume of a sufficient percentage of the pores 407. It is often desirable to completely fill at least some of the pores 407 with the pore-filling material 408. In general, the larger the percentage of completely filled pores the better the performance of the resulting photovoltaic cell device. In particular, porous thin films with pores ranging from 4-10 nm in diameter may be filled with an electron accepting, pore-filling material 408 such as TiO$_2$, ZnO$_2$, ZrO$_2$, CdSe, CdS, CdTe.

One approach to filling the pores 407 of the porous film 406 is to use electrodeposition where the ITO coating in the SiO$_2$ porous film underlayer serves as a conducting electrode to attract metal ions from solution and thus drive the formation of material within the pores 407. In the majority of areas where the pores are filled, the nanoscale grid network 405 will have a very high interfacial surface area for highly efficient exciton splitting, while for the incompletely filled pores, the device will nevertheless-still function as a single-layer optoelectronic or photovoltaic device. In both circumstances, excitons can be split, and the device can produce electric power. By maximizing the number of pores that are filled, the exciton harvesting efficiency may also be maximized.

Pore filling and pore composition may be tested with absorption measurements and XPS depth profiling. XPS involves irradiating a solid in vacuum with mono-energetic soft X-rays and analyzing the energy of electrons emitted as a result. The electron energy spectrum may be obtained as a plot of the number of detected electrons per energy interval versus their binding energy. Each element has a unique spectrum, and so the spectrum from a mixture of elements is approximately the sum of the peaks of the individual constituents. Since the mean free path of electrons in solids is very short, the electrons detected by XPS mostly originate from only the top few atomic layers, making XPS a surface-sensitive technique. XPS may be done in conjunction with sputtering, e.g., magnetron sputtering, to remove material from the surface of the device while doing the XPS analysis. In this way it is possible to determine the chemical composition of materials as a function of depth within the device.

C. Removal of Template to Form the Nanoscale Grid Network

As described above with respect to step 308, after the pores 407 in the porous template film 406 have been filled, the porous template is removed, leaving behind the nanoscale grid network 405. Any suitable technique, such as chemical etching, may be used remove the porous template film 406. The technique used depends, in part, on the material of the porous template film 406 and the pore-filling material 408. For example wet chemical etching using either a strong acid (e.g., 1 M HF) or a strong base (e.g., 5 M KOH at room temperature or elevated temperature) as reacting agents may remove template films made of silica (SiO$_2$), without attacking network grid materials such as TiO$_2$, ZnO, ZrO$_2$, CdSe, CdS, CdTe or the underlying substrate material, e.g., glass or Mylar. Coating these substrate materials with etch-resistant conductive materials such as ITO provides the desired substrate electrode 402. Generally, most metal foils are unsuitable as the underlying substrate electrode 402 as the acid or base tends to attack them. However, etch resistant metals or metals coated with an appropriate etch-resistant and conductive protective material may be used as the substrate electrode 402. The acid or base solution etches away the silica template film, leaving the nanoscale grid network and the underlying substrate electrode 402 intact. Preferably, NaOH or another alkaline solution is used as the etching agent. The alkaline solutions may have a pH of about 9 or above. Alcoholic solutions of NaOH or KOH may also be used to improve the wetting properties of the etching solution.

D. Incorporating Complementary Semiconducting Material into the Grid Network

As described above with respect to step 310, after the porous template film has been removed, spaces 407A in the nanoscale grid network are filled with a complementary network-filling material 406A. For example, semiconducting organic materials, such as conducting polymers may be applied to the nanoscale network grid using spin or dip coating, creating an ordered structure composed of both semiconducting material and conducting polymer. This material combination provides an exciton-splitting and charge transporting network that may form the basis for a photovoltaic device, LED or other optoelectronic device. The conducting polymer infiltrates through the spaces 407A between the structures 408A in nanoscale network grid 405, forming an integrated, active layer that may serve as the basis for an organic-inorganic solar cell. Alternatively, any of the network-filling materials described above with respect to network-filling material 206 may be used to fill the spaces in the network grid 405.

The inventors have determined that the performance of optoelectronic devices improves dramatically where the network filling material is a polymer has been purified, e.g., using rotary evaporation. By way of example, and without limitation, regioregular poly(3-hexylthiophene-2,5-diyl) (P3HT) may be prepared for use as the network filling material 406A using the following procedure.

Using a Soxhlet extraction apparatus, P3HT (0.58 g) may be extracted with anhydrous hexane, e.g., in a 500 mL round-bottom flask under nitrogen for 24 hours. The setup may be wrapped with aluminum foil to protect polythiophene from light. The impurities in the polythiophene material can be removed through chemical extraction. After cooling down, the hexane solvent may be replaced with a chloroform solvent. P3HT can be extracted with chloroform within about an hour. P3HT in chloroform may be collected using a rotary evaporator under nitrogen protection and stored in a glove box. Optoelectronic devices made with P3HT prepared and purified as described above as the network filling material have exhibited light absorption of about 90%.

As described in optional step 312, after the spaces 407A in the grid network 405 have been filled with network-filling material 406A, the filled grid network 405 may then be coated with the second charge transport film 409, e.g. in the form of a layer of electron-accepting material of any of the types described above with respect to the nanoscale grid network 208. The second charge transport film 409 coats the charge splitting network grid 405 contacting electron-accepting portions of the network grid. Any suitable coating technique may be used, e.g., dip coating, web coating, spin coating, spray coating, and the like. The second charge-transport film 409 may be a sol-gel based non-porous film deposited, e.g., using web-coating, dip-coating, spin-coating or spray-coating based deposition. The pore-filling material 408 and second charge transport film 409 may be made from the same material or, alternatively, from different materials.

To make a workable optoelectronic device, e.g., a photovoltaic cell or LED, it is desirable to electrically contact the hole-accepting portions of the network grid 405 to an electrode, e.g. via the second charge transport film 409. As shown in FIGS. 4A-4H, it is possible to make such contact by building a photovoltaic cell device of the type shown in FIG. 2 in two sections and then joining the two sections together. Up to this point in the construction process (step 312 in FIG. 3), the first section 401 a photovoltaic cell device has been built. In an alternative example of steps 314 and 316, which are described in detail below, the second section 415 may be built and the two sections are joined together to form a completed device of the type shown in FIG. 2.

E. Coating of Thin Aluminum Foil Electrode with Charge Transfer Material

By way of example the second electrode 410 may be made from a foil comprised of C- or Cu-coated steel foil, which can also provide for mechanical strength. The foil can be coated with a layer of charge transport material 411 e.g., using a solution containing the same type of semiconductor material used both to fill the spaces 407A and to coat the filled exciton-splitting and transporting network layer 405. Again, any suitable coating process may be used, e.g., dip coating, web coating, spin coating, spray coating and the like. Lamination may also occur within the interface layers 403, 413 or any other layer as long as a multilayer structure of the type depicted in FIG. 4G results.

F. Lamination of Device Sections

Figure 4H:
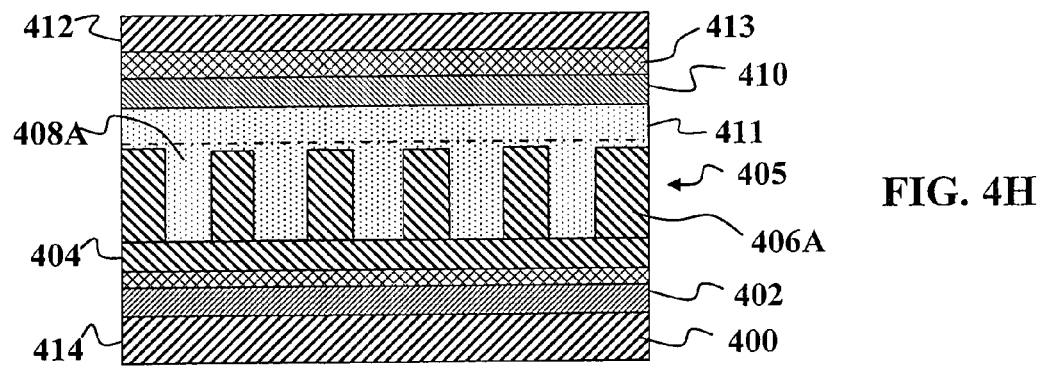

Lamination of a device formed in two sections may be done within or between any of the layers of the device. For example, as shown in FIG. 4H, the first and second sections 401, 415 of a photovoltaic cell device may be attached to each other by lamination at the homo-junction (indicated by the dashed line) between the optional layer of charge transport material 411 coating second electrode 410 and the second charge transport film 409 formed on the network grid 405 and network filling material 406A. Upon lamination, a complete photovoltaic device structure will have been constructed.

IV. ALTERNATIVE EMBODIMENTS

A. Solar Power Generation Systems

Figure 9A:
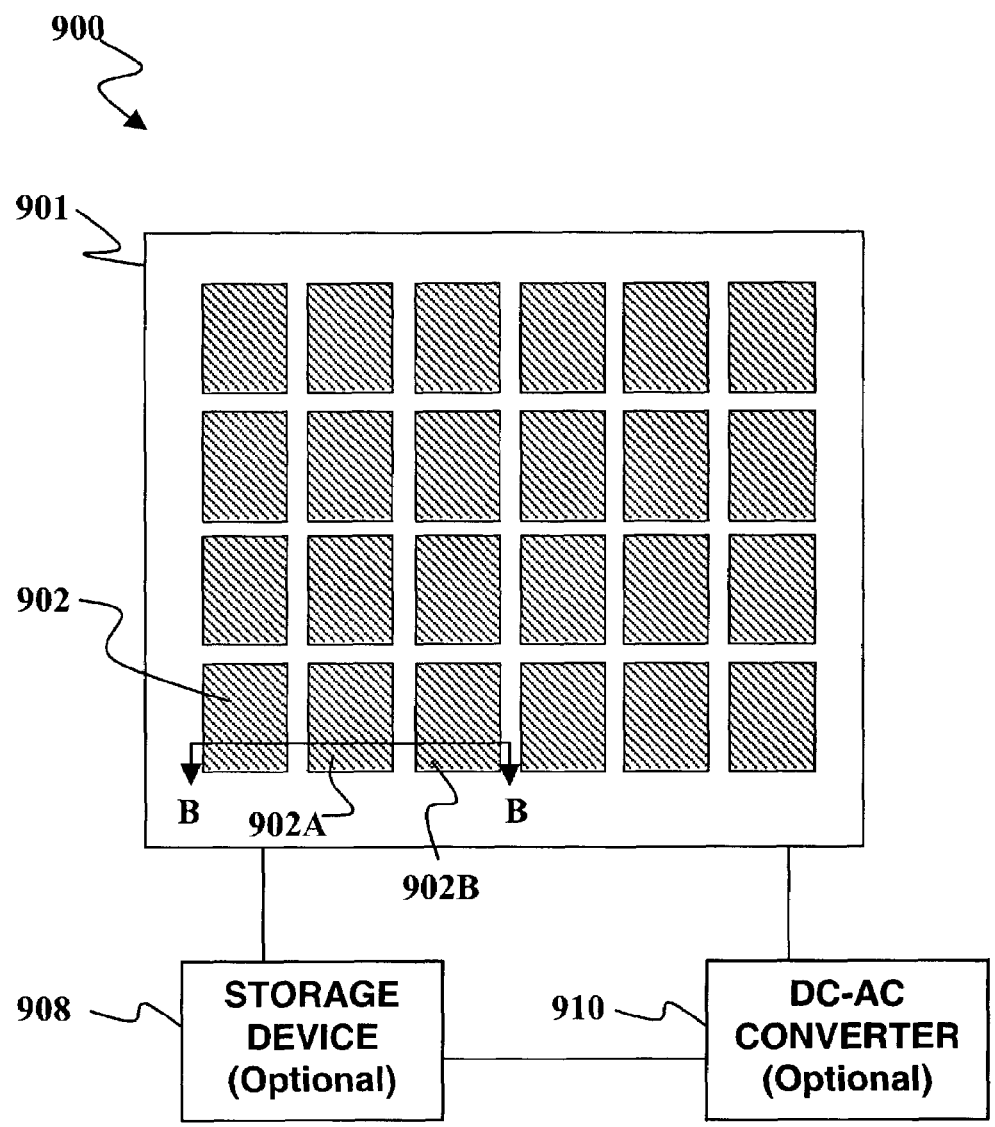
FIGS. 9A-9B depict a solar power generation system according to an embodiment of the present invention.
Figure 9B:
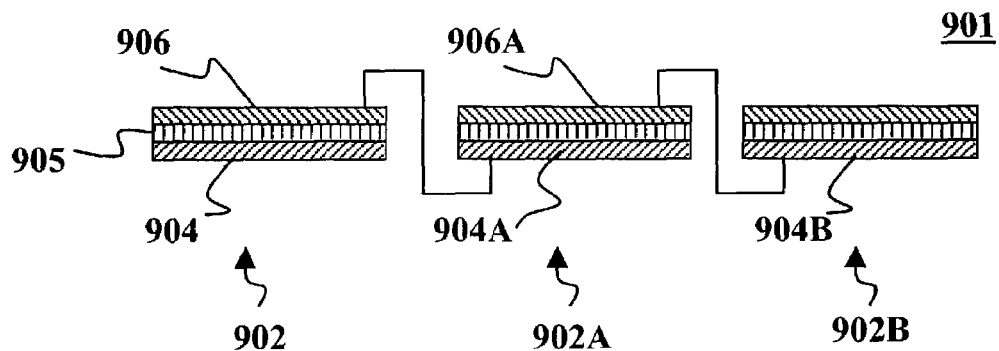

Other embodiments of the present invention may be directed to solar power generation systems that utilize photovoltaic cells that incorporate exciton-splitting and charge transporting networks of the types described above. An example of such a power generation system 900 is depicted in FIGS. 9A-9B. The power system 900 generally comprises an array 901 of photovoltaic cells 902 having features in common with those described above with respect to FIGS. 2 and 4A-4H. In particular, one or more of the cells 902 in the array 901 includes one or more exciton-splitting and charge transporting networks 905 disposed between a first electrode 904 and a second electrode 906. Each charge splitting network 905 includes a nanoscale network grid having uniformly distributed nanometer-scale structures, with spaces between the structures filled with a network-filling material. The network grid and the network-filling material have complementary semiconducting properties with respect to each other, i.e., one material acts an electron-acceptor with respect to the other material, which acts as a hole-acceptor. The electron-acceptor would be in electrical contact with the first electrode 904 and the hole-acceptor material would be in electrical contact with the second electrode 906. An interaction between radiation and the exciton-splitting and charge transporting network 905 generates an electrical voltage between the first electrode 904 and the second electrode 906.

To obtain higher aggregate voltages, two or more cells, e.g., cells 902, or groups of cells, may be electrically connected in series. For example, as shown in FIG. 9B, cells 902, 902A, and 902B are connected in series, with the second electrode 906 of cell 902 connected to the first electrode 904A of cell 902A and the second electrode 906A of cell 902A connected to the first electrode 904B of cell 902B. There are many commercial solutions to interconnect of solar cells, many of which can be applied to the device structure. For example, standard scribing/etching techniques as used by many thin-film manufacturers can be used. For instance, either the first electrode or the second electrode may be separated by laser grooving, mechanical separation (mechanical grooving), or a separating line (e.g., ~0.5 mm wide) can be etched across a large area photovoltaic web using a macroscopic screen (no photolithography is required). Once the cells 902 are divided from one another, they can be interconnected in series by overlapping the transparent electrodes (which can be similarly divided) with the bottom layer.

Organic solar cells often generate higher voltages than most inorganic cell structures, resulting in individual cell voltages between 0.7 and 1.3 V, and thus these cells require fewer interconnects to obtain the higher aggregate voltages as desired in many applications. Conventional cells tend to generate only about 0.5 to 0.8V per cell; and, further, silicon-based cells are restricted to the common silicon wafer sizes so that they need to connect many cells in parallel to obtain high currents by covering a larger surface area.

The system may optionally include an energy storage device 908 connected to the array 901. By way of example, the energy storage system may be in the form of one or more batteries or one or more electrolytic cells for producing hydrogen from water using electricity generated by the cells 902 in the array 901. Alternatively, the cells 902 may be configured to generate hydrogen from water directly using a radiation-driven electrolytic reaction. The storage device 908 may include a storage tank for holding the hydrogen and/or a fuel cell for converting the energy stored in the hydrogen back to electric power on demand.

The system 900 may be scaled as a stand-alone for a commercial or residential facility. Alternatively, the system may include an optional DC-AC converter 910 so that electric power produced by the system 900 may be distributed over a conventional electric power grid. Because of the improved efficiency and lower manufacturing cost of photovoltaic cells of the type described herein the system 900 is potentially capable of producing electric power at a cost per kilowatt hour (kwh) competitive with conventional electric grid rates.

B. Alternative Approaches to Porous Nano-Architected Films

Although the above description describes formation of porous nano-architected films by a particular templated growth technique that uses surfactants as a structuring agent, the present invention is not limited to this technique alone. Porous nano-architected films for exciton-splitting and charge transporting networks or optoelectronic devices may alternatively be fabricated by such approaches as: (a) Intercalation and/or grafting of organic or polymeric molecules within a mineral lamellar network; (b) Synthesis by electrocrystallisation of hybrid molecular assemblies; (c) Impregnation of preformed inorganic gels; (d) Synthesis from heterofunctional metallic alkoxides or silsesquioxannes; (e) Synthesis of hybrid through the connection of well defined functional nanobuilding blocks; (f) templated growth of inorganic or hybrid networks by using organic molecules and macromolecules other than surfactants, e.g., amines, alkyl ammonium ions, amphiphilic molecules, as structure directing agents, and (g) templating with nanoparticles, instead of surfactants, followed by removal of the nanoparticles, leaving behind a porous network. Suitable adjustment of the result effective parameters in these techniques may produce a nano-architected film having interconnected pores that are distributed in a substantially uniform fashion with neighboring pores separated by a distance of between about 1 nm and about 100 nm, wherein the pores have diameters of between about 1 nm and about 100 nm. The interconnected pores may be accessible from an underlying layer and/or overlying layer (if any). The pores in a porous nano-architected produced by any of these techniques may be filled with a pore-filling material having complementary charge transfer properties as described above.

V. CONCLUSION

Embodiments of the present invention provide novel and useful optoelectronic devices, such as photovoltaic cell devices for use in electric power production as well as methods for the manufacture of such materials and power systems using such devices. The exciton-splitting and charge transporting networks and photovoltaic cells described herein are potentially less expensive to manufacture than conventional exciton-splitting and charge transporting networks, optoelectronic devices and photovoltaic cells. It is to be understood that the above description is intended to be illustrative and not restrictive. Many embodiments and variations of the invention will become apparent to those of skill in the art upon review of this disclosure. Merely by way of example a wide variety of process times, reaction temperatures and other reaction conditions may be utilized, as well as a different ordering of certain processing steps. The scope of the invention should, therefore, be determined not with reference to the above description, but instead should be determined with reference to the appended claims along with the full scope of equivalents to which such claims are entitled.

What is claimed is:

1. A method for making an optoelectronic device, the method comprising:

forming a porous film on a substrate by a templation technique, wherein the porous film includes interconnected pores, wherein the pores are substantially uniformly distributed and wherein interconnections of the pores are found within the film, wherein the pores have diameters of between about 1 nm and about 100 nm, and wherein neighboring pores are separated by between about 1 nm and about 100 nm;

substantially filling the pores in the porous film with a pore-filling material, removing the porous template film while leaving behind the pore-filling material that substantially filled the interconnected pores of the film, thereby forming a nanoscale grid network comprising interconnected structures of the pore-filling material that are distributed in a substantially uniform fashion with neighboring structures separated by a distance of between about 1 nm and about 100 nm, wherein the structures have diameters of between about 1 nm and about 100 nm; and incorporating a network-filling material into the nanoscale grid network, whereby the network-filling material substantially fills the spaces between the structures in the nanoscale grid network, wherein the nanoscale grid network and the network-filling material have complementary charge-transfer properties with respect to each other to provide a charge-splitting network in the optoelectronic device.

2. The method of claim 1, wherein the templation technique is a surfactant templation technique and the porous film is a surfactant-templated film.

3. The method of claim 2, wherein the surfactant-templation technique includes:

disposing a sol on a substrate, wherein the sol includes one or more alkoxides, one or more surfactants, one or more condensation inhibitors, water, and ethanol, evaporating the ethanol from the sol to form the surfactant-templated porous film, and covalently crosslinking the film to form a mesoporous grid.

4. The method of claim 3, wherein the sol is disposed on the substrate by web coating, dip coating, spin coating or spray coating.

5. The method of claim 3, further comprising:

heating the surfactant-templated porous film to a temperature sufficient to decompose the surfactant molecules while remaining within the thermal stability range of the substrate.

6. The method of claim 3, further comprising:

annealing the surfactant-templated porous film at a temperature below which the one or more surfactants is pyrolized, and washing the one or more surfactants with a solvent.

7. The method of claim 6, further comprising:

annealing the surfactant-templated porous film before heating the surfactant-templated porous film to a temperature sufficient to decompose the surfactant molecules.

8. The method of claim 3, further comprising exposing the surfactant-templated film to energetic radiation to decompose the surfactant molecules.

9. The method of claim 3 wherein the one or more surfactants, one or more condensation inhibitors, water, and ethanol are in molar ratios in the following ranges with respect to a central element X in one or more of the alkoxides:

surfactant/X: a molar ratio ranging from about $1 \times 10^{-7}$ to about 0.1, ethanol/X: a molar ratio ranging from about 3 to about 20, condensation inhibitor/X: a molar ranging ratio from about $1.0 \times 10^{-5}$ to about 5.0, water/X: a molar ratio ranging from about 1 to about 20.

10. The method of claim 3, wherein the one or more alkoxides include tetraethylorthosilicate (TEOS), the surfactant is poly(ethyleneoxide)-b-poly(propyleneoxide)-b-poly(ethyleneoxide), and HCl is the condensation inhibitor.

11. The method of claim 3 wherein the alkoxide is titanium ethoxide, the surfactant is poly(ethyleneoxide)-b-poly(propyleneoxide)-b-poly(ethyleneoxide), and HCl is the condensation inhibitor.

12. The method of claim 11 wherein the initial sol is prepared by refluxing the one or more alkoxides, ethanol, water and HCl, at approximately 60° C.

13. The method of claim 3 wherein the one or more alkoxides include a blend of two or more alkoxides having different central elements.

14. The method of claim 2, wherein the surfactant-templation technique includes evaporation-induced self-assembly.

15. The method of claim 1, wherein the pore-filling material includes one or more materials selected from the group consisting of Titania ($TiO_2$), zinc oxide ($ZnO_2$), zirconium oxide, lanthanum oxide, niobium oxide, tungsten oxide, strontium oxide, calcium/titanium oxide, sodium titanate and potassium niobate, cadmium selenide (CdSe), cadmium sulfide (CdS), and cadmium telluride (CdTe) and blends of two or more of these.

16. The method of claim 1 wherein the network-filling material includes one or more materials selected from the group consisting of poly(phenylene) and derivatives thereof, poly(phenylene vinylene) and derivatives thereof, poly(thiophene) and derivatives thereof, poly(thienylenevinylene) and derivatives thereof and poly(isothianaphthene) and derivatives thereof, organometallic polymers, polymers containing perylene units, and poly(squaraines) and their derivatives.

17. The method of claim 1 wherein the network-filling material includes one or more materials selected from the group consisting of organic pigments or dyes, azo-dyes having azo chromofores (—N═N—) linking aromatic groups, phthalocyanines, perylenes, naphthalocyanines, squaraines, merocyanines and their respective derivatives, poly(silanes) and poly(germinates).

18. The method of claim 1, wherein the network filling material is a polymer material.

19. The method of claim 18 further comprising purifying the network filling material before incorporating a network-filling material into the nanoscale grid network.

20. The method of claim 19, wherein purifying the network filling material includes collecting the polymer material by rotary evaporation.

21. The method of claim 1 wherein the network-filling material includes an inorganic material.

22. The method of claim 21, wherein the inorganic material includes copper oxide or another metal oxide.

23. The method of claim 1 wherein substantially filling the pores includes electrodepositing a material into the pores.

24. The method of claim 1, further comprising:
covering the porous film with a layer of charge-transport material, wherein the layer of charge-transport material contacts the pore-filling material that substantially fills the pores in the porous film.

25. The method of claim 1 further comprising:
electrically contacting the charge-transport material with an electrode.

26. The method of claim 1 wherein the templation technique uses nanoparticles to form the porous template film.

27. The method of claim 1 wherein removing the porous template film includes etching the porous template film with an acid or alkaline solution without attacking the structure of an underlying substrate.

28. The method of claim 27 wherein acid or alkaline solution is a solution containing sodium hydroxide (NaOH).

29. A method for making an exciton-splitting and charge transporting network, the method comprising:
forming a porous nano-architected template film on a substrate, wherein the porous nano-architected film includes interconnected pores that are substantially uniformly distributed and wherein interconnections of pores are found within the film, wherein the pores have diameters of between about 1 nm and about 100 nm, wherein neighboring pores are separated by between about 1 nm and about 100 nm, wherein the interconnected pores in the porous nano-architected film are accessible from an underlying layer and/or overlying layer;

substantially filling the pores in the porous nano-architected template film with a pore-filling material;

removing the porous template film while leaving behind the pore-filling material that substantially filled the interconnected pores of the film, thereby forming a nanoscale grid network comprising interconnected structures of the pore-filling material that are distributed in a substantially uniform fashion with neighboring structures separated by a distance of between about 1 nm and about 100 nm, wherein the structures have diameters of between about 1 nm and about 100 nm; and incorporating a network-filling material into the nanoscale grid network, whereby the network-filling material substantially fills the spaces between the structures in the nanoscale grid network, wherein the nanoscale grid network and the network-filling material have complementary charge-transfer properties with respect to each other so that an exciton-splitting and charge transporting network is obtained.

30. The method of claim 29, wherein the porous nano-architected film is produced using one or more techniques selected from the group consisting of:
intercalation and/or grafting of organic or polymeric molecules within a mineral lamellar network;

synthesis by electrocrystallisation of hybrid molecular assemblies;

impregnation of preformed inorganic gels, synthesis from heterofunctional metallic alkoxides or silsesquioxannes, synthesis through the connection of well defined functional nanobuilding blocks, templated growth of inorganic or hybrid networks by using organic molecules and macromolecules including surfactants, amines, alkyl ammonium ions, or amphiphilic molecules, as structure directing agents and templated growth with nanoparticles followed by removal of the nanoparticles.

* * * * *